(12) United States Patent
Sumida et al.

(10) Patent No.: US 12,245,446 B2
(45) Date of Patent: Mar. 4, 2025

(54) SEMICONDUCTOR DEVICE HAVING QUANTUM DOTS, DISPLAY DEVICE, IMAGING SYSTEM, AND MOVING BODY

(71) Applicant: CANON KABUSHIKI KAISHA, Tokyo (JP)

(72) Inventors: Takayuki Sumida, Kanagawa (JP); Akira Shimazu, Kanagawa (JP); Takahiro Yajima, Kanagawa (JP); Tomona Yamaguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 789 days.

(21) Appl. No.: 17/161,493

(22) Filed: Jan. 28, 2021

(65) Prior Publication Data
US 2021/0242416 A1 Aug. 5, 2021

(30) Foreign Application Priority Data

Jan. 31, 2020 (JP) .................. 2020-015879

(51) Int. Cl.
*H10K 30/10* (2023.01)
*C09K 11/06* (2006.01)
*C09K 11/66* (2006.01)
*C09K 11/88* (2006.01)
*G09G 3/32* (2016.01)
*H04N 23/80* (2023.01)
(Continued)

(52) U.S. Cl.
CPC .............. *H10K 30/10* (2023.02); *C09K 11/06* (2013.01); *C09K 11/668* (2013.01); *C09K 11/881* (2013.01); *G09G 3/32* (2013.01); *H04N 23/80* (2023.01); *H10K 39/32* (2023.02); *H10K 50/11* (2023.02); *H10K 50/115* (2023.02); *C09K 2211/1007* (2013.01); *H10K 85/30* (2023.02); *H10K 2101/10* (2023.02); *H10K 2102/00* (2023.02)

(58) Field of Classification Search
CPC ........ H10K 30/10; H10K 39/32; H10K 50/11; H10K 50/115; H10K 85/30; H10K 2101/10; H10K 2102/00; H10K 30/35; C09K 11/06; C09K 11/668; C09K 11/881; C09K 2211/1007; G09G 3/32; H04N 23/80; Y02E 10/549
See application file for complete search history.

(56) References Cited

U.S. PATENT DOCUMENTS

2016/0133463 A1 5/2016 Luther
2017/0271604 A1 9/2017 Brown
(Continued)

FOREIGN PATENT DOCUMENTS

CN 104733180 A 6/2015
CN 106398680 A 2/2017
(Continued)

*Primary Examiner* — Victor A Mandala
(74) *Attorney, Agent, or Firm* — Canon U.S.A., Inc. IP Division

(57) ABSTRACT

A semiconductor device includes an anode, a cathode, a first functional layer between the anode and cathode, and a second functional layer between the first functional layer and the cathode. The first functional layer contains a first quantum dot having a first ligand, and the second functional layer contains a second quantum dot having a second ligand different from the first ligand. The second ligand is an aromatic compound having a sulfide bond and an ester bond.

13 Claims, 8 Drawing Sheets

(51) Int. Cl.
  *H10K 39/32* (2023.01)
  *H10K 50/11* (2023.01)
  *H10K 50/115* (2023.01)
  *H10K 85/30* (2023.01)
  *H10K 101/10* (2023.01)
  *H10K 102/00* (2023.01)

(56) References Cited

U.S. PATENT DOCUMENTS

| | | | |
|---|---|---|---|
| 2017/0362255 A1* | 12/2017 | Beard | C09K 11/661 |
| 2018/0254421 A1 | 9/2018 | Kinge | |
| 2019/0207135 A1* | 7/2019 | Kristal | H10K 30/82 |
| 2021/0020838 A1* | 1/2021 | Qin | C09K 11/06 |
| 2021/0020858 A1* | 1/2021 | Qin | H10K 50/16 |
| 2022/0195300 A1* | 6/2022 | Nakata | C01B 19/001 |
| 2022/0416186 A1* | 12/2022 | Takenaka | H10K 50/115 |

FOREIGN PATENT DOCUMENTS

| | | |
|---|---|---|
| CN | 109935721 A | 6/2019 |
| JP | 2006-513458 A | 4/2006 |
| JP | 2019-186738 A | 10/2019 |
| WO | 2015/056750 A1 | 4/2015 |
| WO | 2015/163929 A1 | 10/2015 |

\* cited by examiner

SEMICONDUCTOR DEVICE HAVING QUANTUM DOTS, DISPLAY DEVICE, IMAGING SYSTEM, AND MOVING BODY

BACKGROUND

Technical Field

One disclosed aspect of the embodiments relates to a semiconductor device, a display device, an imaging system, and a moving body.

Description of the Related Art

In many imaging systems, such as cameras, photodiodes, including an impurity diffusion layer formed in a monocrystalline silicon substrate, are used for photoelectric conversion. On the other hand, photoelectric conversion elements having a photoelectric conversion layer containing an organic material or colloidal quantum dots have recently been developed. Such materials of the photoelectric conversion layer have higher photosensitivity than silicon in the long-wavelength region. US2016/0133463 describes a highly photosensitive photoelectric conversion element including a photoelectric conversion layer using colloidal quantum dots. The colloidal quantum dots have a 1,3-benzenedithiol or 4-mercaptobenzoic acid ligand.

The photoelectric conversion element described in U.S. Patent Application Publication No. 2016/0133463 causes electric charges generated when having received light to remain therein Immediately after being irradiated with light in this state, the photoelectric conversion element sometimes has a current value higher than the current induced by the light irradiation and becomes unstable in current value. Such current instability in a semiconductor device, particularly in a photoelectric conversion element, causes noise.

SUMMARY

One disclosed aspect of the embodiments provides a semiconductor device that has a stable current value when irradiated with light.

According to an aspect of the embodiments, a semiconductor device includes an anode, a cathode, a first functional layer between the anode and the cathode, and a second functional layer between the first functional layer and the cathode. The first functional layer contains a first quantum dot having a first ligand, and the second functional layer contains a second quantum dot having a second ligand different from the first ligand. The second ligand is an aromatic compound having a sulfide bond and an ester bond.

Further features of the disclosure will become apparent from the following description of exemplary embodiments with reference to the attached drawings.

DESCRIPTION OF THE EMBODIMENTS

Figure 1:
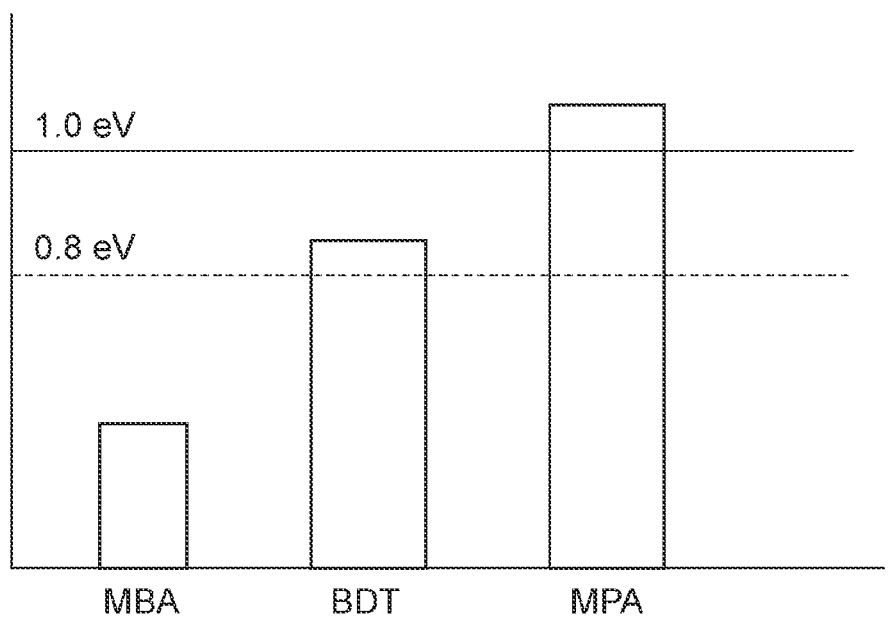
FIG. 1 is a graph showing energy differences between the conduction band minimum (CBM) of a quantum dot and the triplet excited level (T1) of the ligand of the quantum dot.

The semiconductor device disclosed herein includes a first functional layer and a second functional layer between an anode and a cathode. The first and second functional layers contain quantum dots. The anode is an electrode having a higher potential than the cathode when the semiconductor device is in operation. The cathode, on the other hand, has a lower potential than the anode when the semiconductor device in operation. The cathode may be grounded. The quantum dots in the second functional layer have a ligand different from the ligand of the quantum dots in the first functional layer. The quantum dots in the first functional layer may have a higher external quantum efficiency or photoelectric conversion efficiency than the quantum dots in the second functional layer. The quantum dots in the second functional layer has an aromatic compound ligand having a sulfide bond and an ester bond. The presence of such a ligand in the second functional layer enables a decrease in the number of electrons remaining unintentionally in the first layer. Thus, the semiconductor device can have a stable current value when irradiated with light. In the description disclosed herein, having a sulfide bond means having a bond via a sulfur atom, and the sulfide bond may be derived from a thiol group. The sulfide bond may be present in the form of a thiolate anion. The ester bond mentioned herein is defined by a carbon atom, an oxygen atom bound to the carbon atom with a double bond therebetween, and another oxygen atom bound to the carbon atom with a single bond therebetween. The ester bond may be derived from a carboxy group. The carboxy group may be present in the form of a carboxylate. Examples of aromatic compounds having both a sulfide bond and an ester bond include mercaptobenzoic acid (MBA), mercaptonaphthalenecarboxylic acid, and mercaptophenanthrenecarboxylic acid. In some embodiments, mercaptobenzoic acid or mercaptonaphthalenecarboxylic acid may be used.

Current instability during light irradiation causes, for example, image lag or photocurrent fluctuation. Image lag is a phenomenon in which electrons generated in the photoelectric conversion layer are not completely transported by one scan and remain until the next scan. In this instance, the device cannot respond to a sudden change in incident light intensity, forming pictures seeming tailed at a time of actual video shooting. Image lag should be reduced. Photocurrent fluctuation is a phenomenon in which photocurrent fluctuates even when incident light intensity is kept constant. Despite a constant light intensity, bright pictures are formed at a time of actual image shooting. A reduced photocurrent fluctuation is desirable.

In the case of a light-emitting device, if image lag or photocurrent fluctuation occurs, light having a higher brightness than desired may be emitted. For use in light-emitting devices as well, reduced current instability is desirable.

Effect of MBA in Reducing Image Lag

In a semiconductor device according to an embodiment of the present disclosure, mercaptobenzoic acid (MBA) is used to reduce the migration of electrons to the adjacent layer, thereby stabilizing the photocurrent to reduced image lag.

When a bias is applied to a photoelectric conversion element, charge carriers injected from an electrode or generated by light irradiation remain in the photoelectric conversion element and are detected as a signal even in a dark state after interrupting light irradiation. Image lag thus occurs. Photocurrent fluctuation is caused, probably, by accumulation of holes or electrons with time during light irradiation. In an embodiment disclosed herein, MBA is used in a functional layer 133C (shown in FIG. 2B) to reduce electron injection to a functional layer 133B (shown in FIG. 2B) from a second electrode acting mainly to apply a negative bias, thus reducing image lag.

In other words, a semiconductor device having a quantum dot film containing MBA between the second electrode 134 and the functional layer 133B functioning mainly to absorb light hinders electrons generated in the functional layer 133B from reaching the second electrode 134 that collects holes. Also, such a semiconductor device allows electrons generated in the functional layer 133B to efficiently reach the first electrode 131 that collects electrons. In contrast, a semiconductor device including a quantum dot film containing MBA between the first electrode 131 and the functional layer 133B does not hinder electrons generated in the functional layer 133B from reaching the second electrode 134 that collects holes.

Probably, the reason why the presence of MBA results in reduced electron migration between layers is not a difference in energy level but is a low ability of electron migration. This is suggested by the fact that mercaptopropionic acid (MPA), which is not effective in reducing image lag, has a similar energy level to MBA. For supporting the reason, the HOMO level of quantum dot films respectively coordinated with 4-MBA, 3-MBA, 2-MBA, 1,3-benzenedithiol (1,3-BDT), MPA, and $PbI_2$ was measured with an atmospheric photoelectron spectrophotometer AC-3 (manufactured by Riken Keiki).

The 4-MBA-coordinated quantum dot film exhibited an HOMO level at 5.3 eV; the 3-MBA-coordinated quantum dot film, at 5.2 eV; the 2-MBA-coordinated quantum dot film, at 5.2 eV; the 1,3-BDT-coordinated quantum dot film, at 5.2 eV; the MPA-coordinated quantum dot film, at 5.3 eV; and the $PbI_2$-coordinated quantum dot film, at 5.6 eV. Since the difference in HOMO level between the MBA's and MPA is small, these ligand substances have substantially no difference in charge blocking performance resulting from the difference in energy level. Hence, the reason for the effect of reducing image lag is not the difference in energy level between MPA and MBA. The present inventors think that a small ability of MBA to transfer electrons produces the effect of reducing image lag. In the case of a structure including a first functional layer and a second functional layer between the first functional layer and a cathode, accordingly, it is beneficial to give the second functional layer a lower electron transfer ability than the first functional layer.

According to a study of the present inventors, for forming a quantum dot film that can reduce electron migration as the MBA-coordinated quantum dot film can, it is effective to reduce the energy difference between the conduction band minimum (CBM) of the quantum dot and the triplet-excited level (T1) of the ligand of the quantum dot. Also, it is beneficial to reduce the energy difference between the CBM of the quantum dot and the singlet excited level (S1) of the ligand of the quantum dot. In other words, it is beneficial that the energy difference between the T1 of the ligand of the quantum dot and the CBM of the quantum dots in the second functional layer is smaller than the energy difference between the T1 of the ligand of the quantum dot and the CBM of the quantum dots in the first functional layer. Also, it is beneficial that the energy difference between the S1 of the ligand of the quantum dot and the CBM of the quantum dots in the second functional layer is smaller than the energy difference between the S1 of the ligand of the quantum dot and the CBM of the quantum dots in the first functional layer.

More specifically, the CBM energy of the quantum dots in the second functional layer may have a difference of 0.8 eV or less from the T1 energy of the ligand of the quantum dots. In an embodiment, the second functional layer may have a difference of 0.3 eV or less between the CBM energy of the quantum dots and the T1 energy of the ligand of the quantum dots. Also, the difference between the CBM energy of the quantum dots and the S1 energy of the ligand of the quantum dots may be 0.3 eV or less. S1 energy is referred to as lowest excited singlet energy or singlet excitation energy, and T1 energy is referred to as lowest excited triplet energy or triplet excitation energy.

FIG. 1 is a graph presenting energy differences between CBM and T1 depending on the ligand substance. The CBM is that of PbS. The vertical axis of the graph represents the approximate difference between CBM and T1, and the horizontal axis presents ligands: MBA, BDT, and MPA. MBA gives the smallest difference of the three ligands, and the energy difference between the CBM and the T1 is less than 0.3 eV. BDT gives a middle energy difference of about 0.9 eV among the three ligands. MPA gives the largest difference of the three ligands, and the energy difference between the CBM and the T1 is 1.0 eV or more. The solid line in the graph represents the level of 1.0 eV, and the dashed line represents the level of 0.8 eV. Compounds giving an energy difference of 0.8 eV or less between the CBM and the T1 have the same effect as MBA.

Probably, the energy difference between CBM and T1 has the relationship described below with reducing electron migration. For example, MBA has the same chemical structure as MPA except for having an aromatic ring, and the difference in HOMO level therebetween is not large, as described above. However, MBA has a low external quantum efficiency (EQE), and MPA has a higher EQE than MBA. The difference in EQE between MBA and MPA probably results from the difference in charge transportability. The charge transportability of an organic ligand is explained using energy levels in the ground state (S0), singlet excited state (S1), and the triplet excited state (T1), which are electron states of the organic ligand.

The S1 levels of MPA and MBA are higher than the CBM of the quantum dots. Comparing the two ligands, the S1 level of MBA, which has an aromatic ring, is lower than that of MPA. The T1 level of MBA is also lower than that of MPA. Accordingly, the T1 level of MBA is closer than the T1 level of MPA to the CBM level of the quantum dots. Unlike MPA, MBA having an aromatic ring is stable due to the inter-orbital interaction between quantum dots and MBA. Accordingly, the S1 and T1 levels of MBA can be further reduced, promoting energy resonance between the quantum dots and the organic ligand.

As described above, MPA gives a larger energy difference than MBA between the CBM of the quantum dots and the T1 level. Accordingly, electrons generated in a quantum dot migrate to the adjacent quantum dots without exciting the MPA ligand.

In quantum dots having MBA ligand, electrons generated in the quantum dots more likely to excite the MBA compared to quantum dots having MPA ligand, and electron migration to the adjacent quantum dots is reduced. Consequently, quantum dots having MPA ligand exhibit a high EQE, while quantum dots having MBA ligand exhibit a low EQE.

In a semiconductor device including a quantum dot film containing MBA between the first electrode 131 and the functional layer 133B, the number per unit time of electrons generated in the functional layer 133B and reaching the first electrode 131 is thus reduced, and the EQE is considerably reduced.

In the above-described embodiment, MBA is used as a ligand having a benzene skeleton. In an embodiment, the ligand may be a compound having a plurality of benzene rings, such as naphthalene skeleton or anthracene skeleton, may be used. This is because the molecule of such a skeleton has a smaller energy gap than the benzene skeleton between the S0 and S1 states and has reduced S1 and T1 levels and is, accordingly, likely to cause electrons in quantum dots to migrate to the ligand. Thus, electron migration between layers is reduced; hence, the same effect as described above is produced.

The energy difference between the CBM of the quantum dots and the T1 of the ligand may be controlled by selecting an appropriate particle size of the quantum dots because the CBM of quantum dots varies depending on the particle size of the quantum dots. For example, the CBM can be increased by reducing the particle size of the quantum dots to less than 3.0 mm, as long as the quantum dots can sufficiently absorb light in a desired range of wavelengths. High CBM implies shallow CBM. Beneficially, the CBM level is higher than the T1 level.

The present inventors thus found that a multilayer element using MBA as an organic ligand having a thiol group and a carboxy group as functional groups is effective in reducing image lag. In general, a 4-MBA-coordinated quantum dot film alone is not suitable as a major light-absorbing layer of a photoelectric conversion element because the EQE is low. In the case of using a 4-MBA-coordinated quantum dot film as the functional layer 133C that is a component of a multilayer element, however, improved properties are provided in terms of not only EQE but also image lag and photocurrent fluctuation.

Exemplary embodiments of the present disclosure will now be described with reference to the drawings. The embodiments described below are merely some exemplary implementations of the concept of the disclosure, and the disclosure is not limited to disclosed values and structures, including shapes, forms, materials, and arrangements or connections of components or members. For example, while an embodiment described below implements the semiconductor device of the inventive concept as a photoelectric conversion device, the semiconductor device may be implemented as a light-emitting device in another embodiment. Also, the transistors and the conduction types of the semiconductor regions used in the following embodiments may be varied as required.

Like components or elements are designated by the same reference numerals or symbols throughout the drawings, and thus description in some cases may be omitted or simplified. Also, in the drawings presenting a plurality of like elements or components in an arrangement or structure, the reference numeral or symbol of the like elements and description thereof may be omitted.

Structure of Semiconductor Device

Figure 2A:
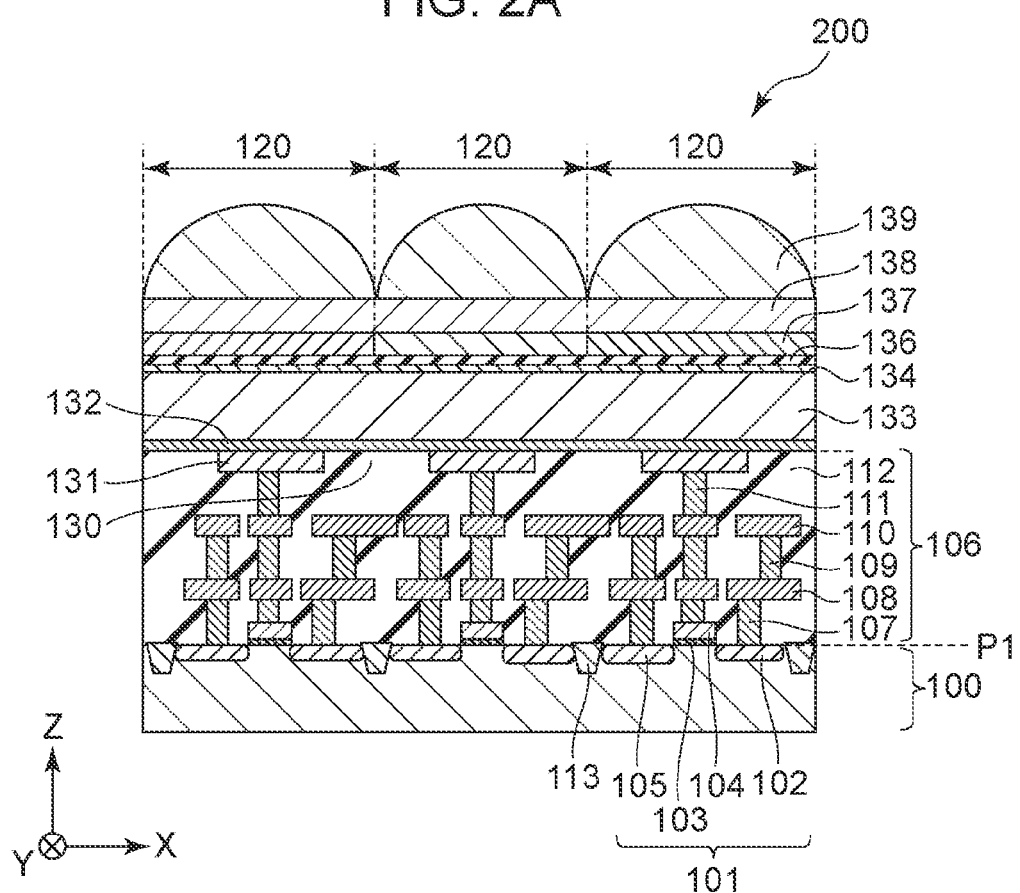
FIG. 2A is a schematic sectional view of a semiconductor device according to an embodiment of the present disclosure.

FIG. 2A is a schematic sectional view of a semiconductor device according to an embodiment of the present disclosure. FIG. 2A illustrates a section of the semiconductor device taken at a plane defined by the Z direction (upward direction of the figure) and the X direction (rightward direction of the figure). The semiconductor device of the illustrated embodiment is a photoelectric conversion device that converts incoming light into electricity to generate charges according to the amount of the incoming light. FIG. 2A illustrates three unit cells 120 of the semiconductor device. The unit cells 120 are often referred to as sub-pixels. The three unit cells 120 may have the same circuit structure as each other. Each unit cell 120 includes at least one photoelectric conversion element.

In an embodiment, the semiconductor device may be a light-emitting device. In such a case, the unit cell 120 includes at least one light-emitting element. The semiconductor device functions as a photoelectric conversion device or a light-emitting device depending on the material of the functional layer of the unit cell 120.

The semiconductor device includes a substrate 100. The substrate 100 in the illustrated embodiment is a monocrystalline silicon substrate or any other semiconductor substrate but, in another embodiment, may be an insulating substrate made of glass, ceramic, or the like. The substrate 100 has a main surface P1. The substrate 100 is provided with transistors 101 and element isolation portions 113 at the main surface P1. Providing transistors at the main surface P1 implies that impurity regions are formed at the surface of the semiconductor substrate to define regions in which channels can be formed.

A transistor 101 may be an N-type MOS transistor including a source/drain region 102, a gate insulating film 103, a gate electrode 104, and a source/drain region 105. The gate insulating film 103 and the gate electrode 104 are formed on the main surface P1. The gate insulating film 103 is disposed between the gate electrode 104 and the main surface P1. The source/drain regions 102 and 105 are disposed within the substrate 100. For an N-type MOS transistor 101, the source/drain regions 102 and 105 are N-type semiconductor regions. The element isolation portion 113 may have a structure for shallow trench isolation (STI).

A wiring structure 106 is disposed over the main surface P1 of the substrate 100. The wiring structure 106 includes contact plugs 107, a wiring layer 108, via plugs 109, a wiring layer 110, via plugs 111, and an insulating layer 112. The insulating layer 112 may be defined by a single layer or a plurality of layers. These members can be formed of any of the metals, insulating materials, and other materials generally used in semiconductor processes.

The contact plugs 107 and the via plugs 109 and 111 may be made of a material selected from the group including aluminum, copper, tungsten, titanium, and titanium nitride. Typically, the contact plugs 107 and the via plugs 109 and 111 may be formed in a multilayer structure made of titanium, titanium nitride, and tungsten. The wiring layers 108 and 110 may be made of a material selected from the group including aluminum, copper, tungsten, titanium, titanium nitride, and tantalum.

Typically, the wiring layers 108 and 110 may be formed in a multilayer structure made of tantalum and copper. The insulating layer 112 may be made of silicon oxide or silicon nitride.

The wiring structure 106 includes a plurality of first electrodes 131 formed apart from each other. The plurality of first electrodes 131 are provided, one for each unit cell 120. Isolation regions 130 are present between each first electrode 131 and the next. The isolation regions 130 may be defined by the insulating layer 112 of the wiring structure 106. Each of the first electrodes 131 is coupled to the corresponding via plug 111. The first electrodes 131 may be made of copper, aluminum, or the like.

The semiconductor device further includes an intermediate layer 132, a functional layer 133, and a second electrode 134. The intermediate layer 132, the functional layer 133, and the second electrode 134 are disposed in this order on the wiring structure 106. The second electrode 134 may be formed continuously across the three unit cells 120. In the illustrated embodiment, the second electrode 134 has flat upper and lower sides. Thus, the semiconductor device has a plurality of first electrodes, a functional layer, and a second electrode, and the functional layer is shared by the plurality of first electrodes. In other words, the semiconductor device includes one functional layer, one second electrode, and a plurality of first electrodes. The first electrodes may be anodes, while the second electrode may be a cathode. An anode is an electrode having a higher potential than the other electrode, cathode, in operation. The anode collects electrons and is also referred to as a positive electrode.

The functional layer 133 is disposed between the plurality of first electrodes 131 and the second electrode 134. The functional layer 133 is a photoelectric conversion layer and can detect light. The first electrodes 131 may be used to read signals generated based on the charges generated by photoelectric conversion.

In an embodiment in which the semiconductor device is implemented as a light-emitting device, the functional layer 133 is operable to emit light. In this instance, the first electrodes 131 are used to transmit control signals to the functional layer 133 for controlling whether light is emitted and controlling the emission intensity.

The intermediate layer 132 is disposed between the discrete first electrodes 131 and the functional layer 133. The intermediate layer 132 enables electrical insulation from either holes or electrons between the first electrodes 131 and the functional layer 133 and enables electrical conduction of the other. Hence, the intermediate layer 132 can be referred to as a carrier injection/blocking layer. In an embodiment in which the first electrodes 131 are cathodes (negative electrodes) to collect holes, the intermediate layer 132 may be an electron blocking layer acting to block electrons and conduct holes. In an embodiment in which the first electrodes 131 are anodes (positive electrodes) to collect electrons, the intermediate layer 132 may be a hole blocking layer acting to block holes and conduct electrons. In the case where the intermediate layer 132 acts as an electron blocking layer, a hole blocking layer (not shown) may be provided between the functional layer 133 and the second electrode 134. In the case where the intermediate layer 132 acts as a hole blocking layer, an electron blocking layer (not shown) may be provided between the functional layer 133 and the second electrode 134.

The intermediate layer 132 may function as an adhesion layer between each of the first electrodes 131 and the functional layer 133. The intermediate layer 132 disposed between the first electrodes 131 and the functional layer 133 may reduce the separation between the first electrodes 131 and the functional layer 133 resulting from a low wettability therebetween. In some embodiments, the intermediate layer 132 is formed over the entire surface of the wiring structure 106, from the viewpoint of increasing the contact area between the intermediate layer 132 and the functional layer 133 and thus reducing the separation. The portion from any one of the first electrodes to the second electrode is referred to as a photoelectric conversion element. The photoelectric conversion element may include a photoelectric conversion layer and intermediate layers disposed between the photoelectric conversion layer and either of the electrodes. The intermediate layers are, more specifically, an electron blocking layer and a hole blocking layer.

The semiconductor device also includes an insulating layer 136, a color filter layer 137, a planarizing layer 138, and a microlens layer 139. The insulating layer 136, a color filter layer 137, the planarizing layer 138, and the microlens layer 139 are disposed in this order on the second electrode 134. The insulating layer 136 may function as a protective layer and a sealing layer. The color filter layer 137 includes color filters each for any of a plurality of colors. Each of the unit cells 120 includes a color filter for the corresponding color. The planarizing layer 138 has a flat upper surface suitable for forming the microlens layer 139. The microlens layer 139 includes a plurality of microlenses. A single unit cell 120 includes a single microlens. The color filters may be arranged in a Bayer array.

Figure 2B:
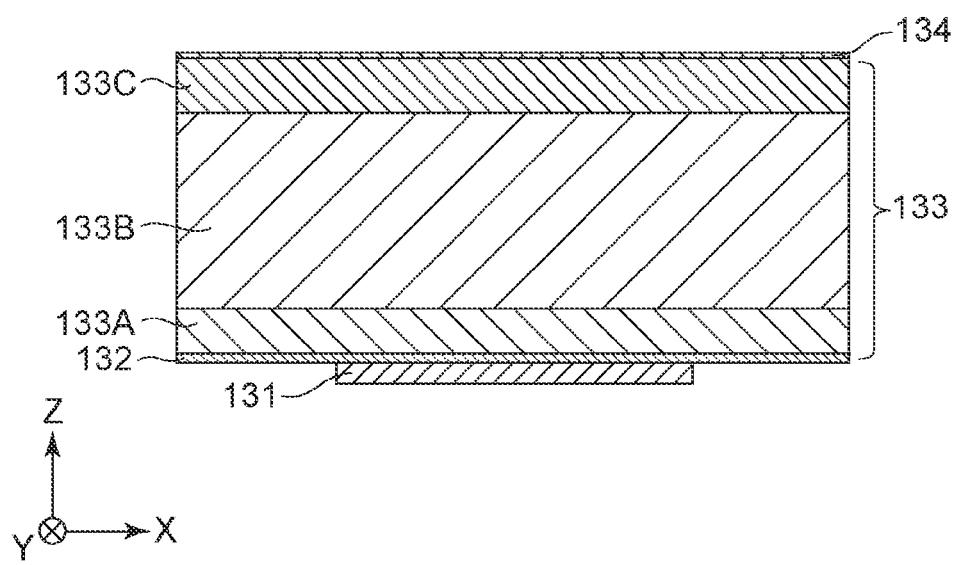
FIG. 2B is a schematic fragmentary sectional view of the semiconductor device depicted in FIG. 2A, illustrating a portion of the semiconductor from a first electrode to a second electrode.

FIG. 2B is a schematic fragmentary sectional view of the semiconductor device depicted in FIG. 2A, illustrating a portion of the semiconductor from any one of the first electrodes to the second electrode. As described above, the first electrodes (anode) 131, the intermediate layer 132, the functional layer 133 (a third functional layer 133A, a first functional layer 133B, and a second functional layer 133C), and the second electrode (cathode) 134 are formed in this order. As depicted in FIG. 2A, the semiconductor device has a plurality of first electrodes 131. The first electrodes share each of the other members formed over the first electrodes. More specifically, a single functional layer structure and a single second electrode are provided for the plurality of first electrodes. The illustrated structure in which these layers are shared by the first electrodes is an example, and, in an embodiment, the plurality of first electrodes may be provided with their respective functional layer structures and second electrodes.

Figure 3:
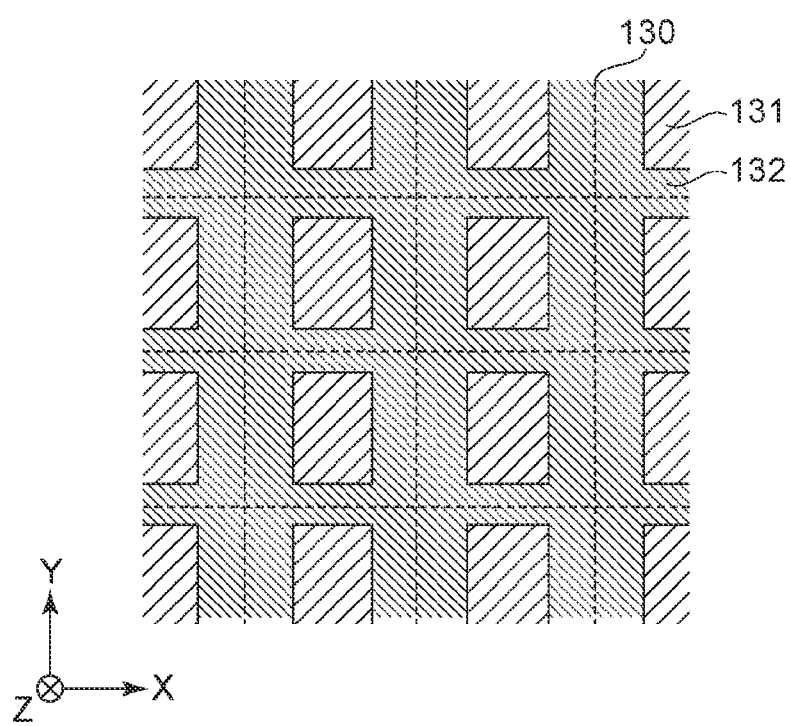
FIG. 3 is a fragmentary schematic plan view of a semiconductor device according to an embodiment of the present disclosure, illustrating an arrangement of a plurality of first electrodes and an intermediate layer.

FIG. 3 is a fragmentary schematic plan view of a semiconductor device according to an embodiment of the present disclosure, illustrating an arrangement of a plurality of first electrodes 131 and the intermediate layer 132. The schematic plan view illustrates a portion of the semiconductor device viewed in a direction perpendicular to the main surface P1. For a photoelectric conversion device, the unit cells 120 are arranged in a matrix manner with a plurality of rows and a plurality of columns, corresponding to the regions defined by the respective first electrodes 131. The intermediate layer 132 is disposed over and across all the first electrodes 131 and the isolation regions 130. Thus, the contact area between the intermediate layer 132 and the functional layer 133 is increased, reducing separation therebetween effectively, as described above.

Materials of Functional Layer and Intermediate Layer of the Semiconductor Device The material of the functional layer 133 of the semiconductor device disclosed herein will now be described. The functional layer 133 functions as a photoelectric conversion layer, as described above, and is not otherwise limited, including the material and production process thereof. The functional layer 133 may include a colloidal quantum dot film defined by an aggregate of nanoparticles of, for example, a compound semiconductor.

Ligand of Quantum Dots

The quantum dots used in the semiconductor device disclosed herein have a ligand. The ligand has a thiol group but is not limited to 1,3-benzenedithiol (BDT). Ligand substances having a benzene ring, including 1,4-BDT and 1,2-BDT, have a boiling point of 200° C. or more. Such ligands are not likely to separate or evaporate from the quantum dot surfaces even under conditions of 140° C. and are effective in increasing the heat resistance of the quantum dots. The ligand of quantum dots is bound to the inorganic particles defining quantum dots. In other words, the ligand of quantum dots may be referred to as a component of the quantum dots. Examples of the ligand having a thiol group include 4-methyl-1,2-benzenedithiol, 1,3,5-benzenetrithiol, 5-bromo-1,3-benzenedithiol, 4-chloro-1,3-benzenedithiol, 3,6-dichloro-1,2-benzenedithiol, 4,6-dichloro-1,3-benzenedithiol, 2,5-diamino-1,4-benzenedithiol, 4,6-diamino-1,3-benzenedithiol, 1,2,4,5-benzenetetrathiol, 3,4,5,6-tetrachloro-1,2-benzenedithiol, 3,4,5,6-tetrafluoro-1,2-benzenedithiol, 3-methyl-1,2-benzenedithiol, 4,5-dimercapto-1,2-benzenedicarbonitrile, and 4-fluoro-1,2-benzenedithiol. The ligand having a thiol group may have a naphthalene skeleton, and examples thereof include 2,6-naphthalenedithiol, 1,5-naphthalenedithiol, 2,7-naphthalenedithiol, 1,8-naphthalenedithiol, and 1,4-naphthalenedithiol. The external quantum efficiency EQE (or photoelectric conversion efficiency) depends on the distance between each colloidal quantum dot and the next, and the distance varies depending on the ligand used. It is, therefore, beneficial to reduce the size of the ligand molecule.

The ligand may have a thiol group and an aromatic ring having a carboxy group. Such a ligand may be, but is not limited to, 4-mercaptobenzoic acid (4-MBA). Example of such a ligand include 5-bromo-2-mercaptobenzoic acid, 4-fluoro-2-mercaptobenzoic acid, 4-amino-3-mercaptobenzoic acid, 5-chloro-2-mercaptobenzoic acid, 5-fluoro-2-mercaptobenzoic acid, 4-bromo-2-mercaptobenzoic acid, 2,3,5,6-tetrafluoro-4-mercaptobenzoic acid, 4-amino-5-mercapto-2-methoxybenzoic acid, 2-bromo-4-mercaptobenzoic acid, 4-chloro-2-mercaptobenzoic acid, 4-fluoro-3-mercaptobenzoic acid, 2-chloro-4-mercaptobenzoic acid, 2-chloro-5-mercaptobenzoic acid, 2-mercapto-3-methylbenzoic acid, 4-mercapto-2-methoxybenzoic acid, 2-mercapto-5-methoxybenzoic acid, 5-mercapto-2-methoxy-4-methylbenzoic acid, 5-mercapto-2-nitrobenzoic acid, 3-chloro-4-mercaptobenzoic acid, 4-amino-3-mercapto-5-methoxybenzoic acid, 2-fluoro-5-mercaptobenzoic acid, 2-mercapto-5-methylbenzoic acid, 2-mercapto-5-nitrobenzoic acid, 2-bromo-5-mercaptobenzoic acid, 4-mercapto-1,3-benzenedicarboxylic acid, 2-chloro-6-mercaptobenzoic acid, 2-fluoro-4-mercaptobenzoic acid, 2-mercapto-4-methylbenzoic acid, 3,5-dichloro-2-mercaptobenzoic acid, 3-mercapto-4-nitrobenzoic acid, 2-mercapto-4-methoxybenzoic acid, 5-amino-2-mercaptobenzoic acid, 4-mercapto-1,2-benzenedicarboxylic acid, 3,5-dimercaptobenzoic acid, 2-mercapto-3,5-dimethylbenzoic acid, 2-mercapto-4,5-dimethoxybenzoic acid, 4-mercapto-3-nitrobenzoic acid, 3-hydroxy-5-mercapto-4-methoxybenzoic acid, 3-chloro-2-mercaptobenzoic acid, 2,5-dimercapto-1,4-benzenedicarboxylic acid, 2-mercapto-1,4-benzenedicarboxylic acid, 4-amino-2-mercaptobenzoic acid, 5-mercapto-2-methoxybenzoic acid, 2-fluoro-6-mercaptobenzoic acid, 5-mercapto-1,3-benzenedicarboxylic acid, 4-bromo-3-mercaptobenzoic acid, 4-mercapto-3-methylbenzoic acid, 2-mercapto-6-methylbenzoic acid, 4-chloro-3-mercaptobenzoic acid, 3,5-dibromo-2-mercaptobenzoic acid, 3-mercapto-4-methoxybenzoic acid, 5-mercapto-2-methylbenzoic acid, 5-acetyl-2-mercaptobenzoic acid, 5-chloro-2-mercapto-3-methylbenzoic acid, 3-mercapto-2-methylbenzoic acid, 5-mercapto-1,3-benzenedicarboxylic acid 1-methyl ester, 3-mercapto-4-methyl-5-nitrobenzoic acid, 3-fluoro-2-mercaptobenzoic acid, 3-amino-4-mercaptobenzoic acid, 2-mercapto-5-(trifluoromethyl)benzoic acid, 2,4-dichloro-5-mercaptobenzoic acid, 4-amino-2-ethoxy-5-mercaptobenzoic acid, 4-hydroxy-3-mercaptobenzoic acid, 2-mercapto-3,6-dimethylbenzoic acid, 3-fluoro-4-mercaptobenzoic acid, 5-hydroxy-2-mercaptobenzoic acid, 5-mercapto-2,4-dimethylbenzoic acid, 5-iodo-2-mercaptobenzoic acid, 5-mercapto-2,3-dimethoxybenzoic acid, 4-fluoro-5-mercapto-2-nitrobenzoic acid, 2-amino-3-mercaptobenzoic acid, 4-chloro-3-mercapto-5-methylbenzoic acid, 2,3-difluoro-5-mercaptobenzoic acid, 3-chloro-2-fluoro-5-mercaptobenzoic acid, 5-cyano-2-mercapto-4-methylbenzoic acid, 2-(aminomethyl)-4-cyano-6-mercaptobenzoic acid, 2-cyano-6-mercapto-4-methylbenzoic acid, 4-(bromomethyl)-2-cyano-6-mercaptobenzoic acid, 5-chloro-2-cyano-4-mercaptobenzoic acid, 2-cyano-6-ethyl-4-mercaptobenzoic acid, 4-cyano-5-ethyl-2-mercaptobenzoic acid, 2-(bromomethyl)-4-cyano-3-mercaptobenzoic acid, 6-(bromomethyl)-3-cyano-2-mercaptobenzoic acid, 6-chloro-2-cyano-3-mercaptobenzoic acid, 2-cyano-5-ethyl-3-mercaptobenzoic acid, 4-(aminomethyl)-2-cyano-3-mercaptobenzoic acid, 5-(aminomethyl)-2-cyano-4-mercaptobenzoic acid, 2-cyano-3-ethyl-6-mercaptobenzoic acid, 3-cyano-4-ethyl-5-mercaptobenzoic acid, 6-cyano-2-ethyl-3-mercaptobenzoic acid, 2-(aminomethyl)-5-cyano-4-mercaptobenzoic acid, 2-(bromomethyl)-5-cyano-4-mercaptobenzoic acid, 2-(bromomethyl)-3-cyano-6-mercaptobenzoic acid, 5-(bromomethyl)-2-cyano-3-mercaptobenzoic acid, 4-(bromomethyl)-3-cyano-5-mercaptobenzoic acid, 5-chloro-4-cyano-2-mercaptobenzoic acid, 3-(chloromethyl)-2-cyano-6-mercaptobenzoic acid, 4-(chloromethyl)-5-cyano-2-mercaptobenzoic acid, 2-(bromomethyl)-6-cyano-3-mercaptobenzoic acid, 2-(chloromethyl)-3-cyano-4-mercaptobenzoic acid, 3-(chloromethyl)-2-cyano-5-mercaptobenzoic acid, 3-chloro-2-cyano-5-mercaptobenzoic acid, 3-cyano-5-mercapto-2-methylbenzoic acid, 2-(aminomethyl)-6-cyano-3-mercaptobenzoic acid, 3-cyano-2-ethyl-6-mercaptobenzoic acid, 3-(bromomethyl)-2-cyano-5-mercaptobenzoic acid, 2-chloro-3-cyano-5-mercaptobenzoic acid, 3-chloro-6-cyano-2-mercaptobenzoic acid, 2-(aminomethyl)-5-cyano-3-mercaptobenzoic acid, 5-(bromomethyl)-3-cyano-2-mercaptobenzoic acid, 3-chloro-2-cyano-4-mercaptobenzoic acid, 4-cyano-3-ethyl-2-mercaptobenzoic acid, 2-(chloromethyl)-3-cyano-5-mercaptobenzoic acid, 3-(chloromethyl)-4-cyano-2-mercaptobenzoic acid, 4-chloro-3-cyano-5-mercaptobenzoic acid, 2-(chloromethyl)-5-cyano-3-mercaptobenzoic acid, 2-cyano-4-mercapto-5-methylbenzoic acid, 5-cyano-3-mercapto-2-methylbenzoic acid, 2-cyano-4-ethyl-5-mercaptobenzoic acid, 3-cyano-5-ethyl-4-mercaptobenzoic acid, 4-cyano-3-mercapto-2-methylbenzoic acid, 2-(aminomethyl)-6-cyano-4-mercaptobenzoic acid, 2-(bromomethyl)-3-cyano-4-mercaptobenzoic acid, 6-(bromomethyl)-2-cyano-3-mercaptobenzoic acid, 4-(chloromethyl)-3-cyano-2-mercaptobenzoic acid, 3-(bromomethyl)-6-cyano-2-mercaptobenzoic acid, 3-(bromomethyl)-4-cyano-5-mercaptobenzoic acid, 5-(bromomethyl)-4-cyano-2-mercaptobenzoic acid, 6-(chloromethyl)-3-cyano-2-mercaptobenzoic acid, 5-cyano-2-ethyl-3-mercaptobenzoic acid, 2-chloro-3-cyano-6-mercaptobenzoic acid, 3-chloro-4-cyano-2-mercaptobenzoic acid, 6-cyano-2-mercapto-3-methylbenzoic acid, 3-(chloromethyl)-4-cyano-5-mercaptobenzoic acid, 2-cyano-4-ethyl-6-mercaptobenzoic acid, 6-cyano-3-ethyl-2-mercaptobenzoic acid, 2-chloro-3-fluoro-4-mercaptobenzoic acid, 5-mercapto-2,4-dimethoxybenzoic acid, 2-mercapto-6-methyl-3-(1-methylethyl)benzoic acid, 2-mercapto-3-methoxybenzoic acid, 2-hydroxy-4-mercaptobenzoic acid, 2-mercapto-3,6-dimethoxybenzoic acid, 4,5-diethoxy-2-mercaptobenzoic acid, 3-mercapto-2-nitrobenzoic acid, 3,5-difluoro-4-mercaptobenzoic acid, 3-mercapto-4-methylbenzoic acid, 4-ethyl-3-mercaptobenzoic acid, 4-mercapto-3-methoxybenzoic acid, 4,5-difluoro-2-mercaptobenzoic acid, 2,5-dichloro-3-mercaptobenzoic acid, 2-bromo-3-mercapto-5-methylbenzoic acid, 5-chloro-2-iodo-3-mercaptobenzoic acid, 3-fluoro-5-mercapto-4-methoxybenzoic acid, 3-chloro-4-fluoro-5-mercaptobenzoic acid, 2-bromo-5-fluoro-3-mercaptobenzoic acid, 2,6-difluoro-3-mercaptobenzoic acid, 3,4-dichloro-5-mercaptobenzoic acid, 3-fluoro-5-mercapto-4-methylbenzoic acid, 3-bromo-5-mercapto-4-methylbenzoic acid, 2,3-dichloro-5-mercaptobenzoic acid, 3-chloro-4-iodo-5-mercaptobenzoic acid, 3-chloro-5-mercapto-2-methylbenzoic acid, 5-mercapto-4-methyl-2-nitrobenzoic acid, 2-mercapto-4-(trifluoromethyl)benzoic acid, 2,3-dichloro-4-mercaptobenzoic acid, 2-hydroxy-5-mercaptobenzoic acid, 5-(1,1-dimethylethyl)-2-mercapto-1,3-benzenedicarboxylic acid, 5-(aminosulfonyl)-2-mercaptobenzoic acid, 3-amino-2-mercaptobenzoic acid, 4-mercapto-2-nitrobenzoic acid, 3-mercapto-4-methyl-2-nitrobenzoic acid, 2-mercapto-6-(methylthio) benzoic acid, 5-mercapto-2,3-dimethylbenzoic acid, 2-mercapto-4,6-dimethylbenzoic acid, 3-mercapto-4,5-dimethylbenzoic acid, 3-(1,1-dimethylethyl)-4-mercaptobenzoic acid, and 4-chloro-3-mercapto-2-methylbenzoic acid. The ligand having a thiol group and an aromatic ring having a carboxy group may have a naphthalene skeleton, and examples of such a ligand include 3-mercapto-2-naphthoic acid and 6-mercapto-1-naphthoic acid. The external quantum efficiency EQE depends on the distance between each colloidal quantum dot, and the distance varies depending on the ligand used. It is, therefore, beneficial to reduce the size of the ligand molecule.

An embodiment using a functional layer 133 defined by colloidal quantum dots including semiconductor nanoparticles will now be described. The colloidal quantum dots include nanoparticles having an average particle size of 0.5 nm or more and less than 100 nm. The material of the nanoparticles may be an elemental semiconductor (Group IV semiconductor) or a compound semiconductor. The compound semiconductor may be a III-V semiconductor compound, a II-VI semiconductor compound, or a semiconductor compound made up of a combination of three or more elements selected from the Groups II, III, IV, V, and VI. More specifically, examples of the material of nanoparticles include PbS, PbSe, PbTe, InN, InAs, InP, InSb, InAs, InGaAs, CdS, CdSe, CdTe, Ge, CuInS, CuInSe, CuInGaSe, and Si. These semiconductors have a relatively narrow band gap. The colloidal quantum dots may be defined by the same type of nanoparticles or two or more types of nanoparticles. Colloidal quantum dots made of such materials are also referred to as semiconductor quantum dots. The nanoparticles may have a core-shell structure including a core containing a semiconductor, and a shell covering the core.

The nanoparticles may be set to a size less than or close to the exciton Bohr radius of the semiconductor. In this instance, a quantum size effect arises and gives the nanoparticles a desired band gap according to the size of the particles. Hence, light absorption wavelength or emission wavelength is controlled by forming a quantum dot film with nanoparticles controlled to a predetermined size.

In some embodiments, the nanoparticles are made of PbS or PbSe from the viewpoint of easy synthesis. Since the exciton Bohr radius of PbS is about 18 nm, the average particle size of the nanoparticles may be in the range of 2 nm to 15 nm from the viewpoint of controlling crystal growth and producing the quantum size effect. Nanoparticles having an average particle size of 2 nm or more are easy to synthesize in terms of control of crystal growth. The size of the nanoparticles may be measured under a transmission electron microscope.

The thickness of the functional layer 133 is not particularly limited but may be 10 nm or more, or 50 nm or more, from the viewpoint of achieving high light absorption. Also, from the viewpoint of easy formation, the thickness of the functional layer 133 may be 800 nm or less.

The material of the intermediate layer 132 of the semiconductor device disclosed herein will now be described. The intermediate layer 132 may be an electron blocking layer or a hole blocking layer according to the type of carriers collected by the first electrodes 131, as described above. In addition, the intermediate layer 132 has a function as an adhesion layer to reduce the separation of the functional layer 133.

An embodiment in which the intermediate layer 132 acts as an electron blocking layer will first be described. The electron blocking layer may be made of a material capable of efficiently transporting holes generated in the functional layer 133 acting as a photoelectric conversion layer to the cathode and hindering electrons generated in the functional layer from migrating to the cathode. The material of the electron blocking layer may have a high hole mobility and a high electric conductivity and allows a low barrier to hole injection to the cathode and a low barrier to electron injection to the electron blocking layer from the photoelectric conversion layer. For a semiconductor device in which light enters the photoelectric conversion layer through the electron blocking layer, the electron blocking layer may be made of a transparent material. In this instance, the visible light transmittance of the electron blocking layer may be 60% or more or 80% or more. Accordingly, the electron blocking layer may be made of a P-type inorganic semiconductor, such as molybdenum oxide ($MoO_3$) or nickel oxide (NiO), or a P-type organic semiconductor, such as PEDOT: PSS.

For a semiconductor device acting as a light-emitting device, the electron blocking layer may be disposed between the anode and the functional layer. In this instance, the electron blocking layer functions as a layer to hinder electrons from migrating from the functional layer to the anode.

Next, an embodiment in which the intermediate layer 132 acts as a hole blocking layer will be described. The hole blocking layer has a function, contrary to the electron blocking layer, of blocking holes generated in the functional layer and transport electrons to the anode. The favorable properties of the hole blocking layer, therefore, may be explained as the properties of the electron blocking layer described above in which the anode and the P-type semiconductor are replaced with the cathode and an N-type semiconductor, respectively. For a semiconductor device in which light enters through the anode or light reflected from the anode is used, a transparent material may be used to form the hole blocking layer. Accordingly, the hole blocking layer may be made of an N-type wide-gap semiconductor, such as titanium oxide ($TiO_2$) or zinc oxide (ZnO), or an N-type semiconductor such as fullerene ($C_{60}$). Inorganic oxide semiconductors are less soluble in the quantum dot dispersion liquid that is to be applied onto a surface in a manufacturing process and are therefore beneficial.

For a semiconductor device acting as a light-emitting device, the hole blocking layer may be disposed between the cathode and the functional layer. In this instance, the hole blocking layer functions as a layer to hinder holes from migrating from the functional layer to the anode.

The thickness of the intermediate layer 132 may be, but is not limited to, about 1 nm to 100 nm. A thin intermediate layer 132 reduces the voltage to be applied to the functional layer 133. In contrast, a thick intermediate layer 132 reduces the risk of the tunneling effect that causes electrons or holes to pass through the intermediate layer 132. In addition, the thick intermediate layer 132 reduces the occurrence of pinholes and other film defects. For example, an intermediate layer 132 having a thickness larger than the surface roughness of the first electrode 131 can reduce film defects. The thickness of the intermediate layer 132 may be appropriately set from these viewpoints.

Other Components of Semiconductor Device

The material of the first electrodes 131 and the second electrode 134 of the semiconductor device disclosed herein will now be described. The first electrodes 131 and the second electrode 134 may be made of any electrically conductive material. Examples of the material of the first electrodes 131 and the second electrode 134 include elemental metals, such as platinum, gold, silver, aluminum, chromium, nickel, copper, titanium, and magnesium, and alloys containing two or more of such metals. Alternatively, the first electrodes 131 and the second electrode 134 may be made of a metal oxide, such as indium oxide or tin oxide, or a composite oxide containing such a metal oxide, for example, ITO (indium tin oxide) or IZO (indium zinc oxide). The material of the first electrodes 131 and the second electrode 134 may be electrically conductive particles, such as carbon black, fullerene, carbon nanotubes, or graphene. A composite material prepared by dispersing such conductive particles in a matrix such as a polymer binder may also be used. The material of the first and second electrodes 131 and 134 may be an individual one or a combination of the materials cited above.

In some embodiments, at least either the first electrodes 131 or the second electrode 134 may be transparent. The transparent electrode can transmit light to be absorbed by the functional layer 133. In a semiconductor device acting as a light-emitting device, the transparent electrode transmits light emitted from the functional layer 133.

The first electrodes 131 and the second electrode 134 collect electrons or holes generated in the functional layer 133. Accordingly, it is beneficial to select a material suitable for collecting electrons or holes as the material of the first electrodes 131 and the second electrode 134. Materials having a high work function are suitable for collecting holes, and such materials include gold and ITO. Materials having a low work function are suitable for collecting electrons, and aluminum is one example of such materials.

The thickness of the first electrodes 131 and the second electrode 134 is not particularly limited and may be set in view of, for example, electric conductivity and transparency. Typically, the thickness of the first and second electrodes is about 10 nm to 10 μm.

Manufacturing Process of Semiconductor Device

Figure 4A:
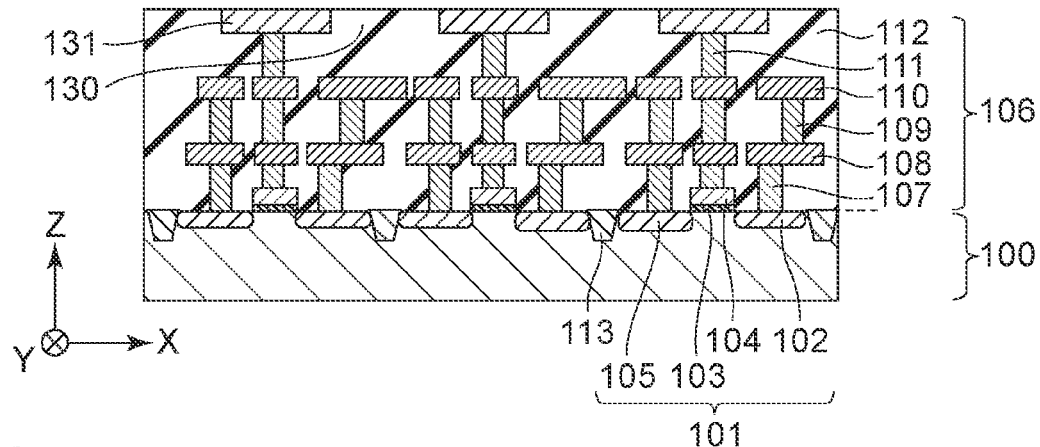
FIGS. 4A to 4C are schematic sectional views illustrating a method for producing a semiconductor device according to an embodiment of the present disclosure.
Figure 4B:
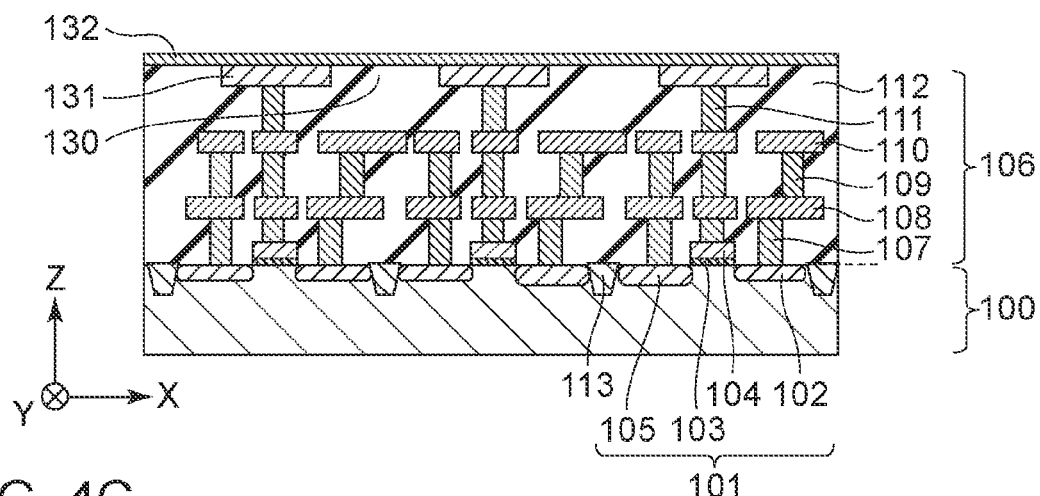
Figure 4C:
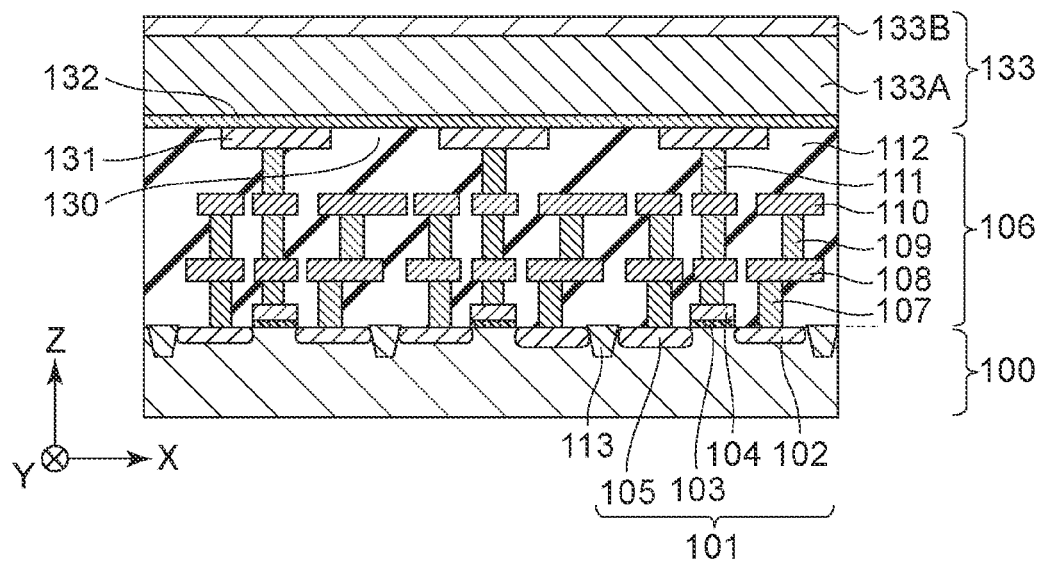

FIGS. 4A to 4C are schematic sectional views illustrating a method for manufacturing the semiconductor device disclosed herein.

A process step of forming a wiring structure 106 will first be described with reference to FIG. 4A. First, a substrate 100 is prepared. Next, element isolation portions 113 and transistors 101 are formed in the substrate 100. Then, a wiring structure 106 is formed on the substrate 100. The wiring structure 106 may be formed of, for example, silicon oxide. First electrodes 131 are then formed right above via holes 111. After the formation of the first electrodes 131, the insulating layer 112 may be formed again additionally. In this instance, the insulating layer 112 and the first electrodes are planarized so that the upper surface of the insulating layer 112 becomes flush with the upper surfaces of the first electrodes 131. The planarization may be performed by etching or chemical mechanical polishing (CMP). The layers described up to here can be formed by conventional semiconductor processes.

A process step of forming an intermediate layer 132 will next be described with reference to FIG. 4B. The intermediate layer 132 is formed on the insulating layer 112 and the first electrodes 131 by vapor deposition or sputtering, thus completing the structure shown in FIG. 4B. For example, for forming a titanium oxide intermediate layer 132, titanium oxide is deposited by using a $TiO_2$ target and a sputtering apparatus, for example, at an RF power of 500 W. The gas introduced may be prepared by mixing argon gas flowing at a rate of 100 standard cubic centimeters per minute (sccm) with oxygen gas flowing at a rate of 5 sccm to 15 sccm. The pressure in the chamber may be 0.5 Pa.

Next, a process step of forming a functional layer 133 will be described with reference to FIG. 4C. After the completion of the structure depicted in FIG. 4B, a functional layer 133 is formed by forming mainly quantum dots. In the following description of forming the functional layer 133, a process for forming lead sulfide (PbS) quantum dots will be described by way of example. Specific process conditions described below are merely examples and do not limit the manufacturing process of the semiconductor device.

An exemplary process for synthesizing PbS quantum dots will first be described. Into a three-neck flask are introduced 892 mg of lead oxide (PbO), 40 mL of octadecene, and 4 mL of oleic acid, and the flask is placed in an oil bath. The oil bath is heated to 90° C. At this time, nitrogen is introduced into the three-neck flask at a flow rate of 0.5 mL/m to form a nitrogen atmosphere, thereby suppressing oxidation of quantum dots during the reaction. The solution under a reaction, which has been light yellow before being placed in the oil bath, is stirred for 30 minutes or more until the solution turns transparent.

At the same time, 20 mL of 1.9 mM solution of bis (trimethylsilyl) sulfide in octadecene is prepared in a glove box in a nitrogen atmosphere. This solution is a sulfur source. The sulfur source solution is rapidly added to the transparent solution in the three-neck flask. One minute after the addition of the sulfur source, the three-neck flask is removed from the oil bath and cooled at room temperature for 2 hours. After the solution temperature reaches room temperature, the next step, purification, is performed. The solution after the synthesis is black, suggesting that lead sulfide (PbS) quantum dots have been produced with the surfaces protected by oleic acid.

The step of purification will next be described. The resulting dispersion liquid of quantum dots in octadecene is removed into a centrifugal tube from the three-neck flask. Acetone, which is a polar solvent, is added to the dispersion liquid and then, the quantum dots become unable to keep dispersed in octadecene. The centrifugal tube into which acetone is added is subjected to centrifugation in a centrifuge to settle the quantum dots. The centrifugation is performed, for example, at 17000 rpm for 20 minutes.

Subsequently, after removing the centrifugal tube from the centrifuge, the transparent supernatant fluid, acetone, is discarded, and toluene, which is a nonpolar solvent, is added to the quantum dots resting on the bottom of the centrifugal tube. Then, the centrifugal tube is shaken to disperse the quantum dots again in toluene. After adding acetone to the dispersion of the quantum dots in toluene, the quantum dot dispersion liquid is centrifuged again at 15000 rpm for 5 minutes, thus settled out again.

The series of steps, settling with acetone and dispersion in toluene, is repeated three times. Methanol, ethanol, or any other polar solvent may be used instead of acetone. However, polar solvents that do not much affect the oleic acid protecting the quantum dots nor cause the oleic acid to separate from the surfaces of the quantum dots are suitable.

The preparation of a quantum dot liquid to be applied onto a surface for forming a quantum dot film will now be described. The quantum dots are settled by centrifugation with acetone added to the quantum dot dispersion in toluene. Then, the quantum dots are finally dispersed in not toluene but octane, and the dispersion liquid is adjusted to a quantum dot content of 80 mg/mL. This liquid is used as the quantum dot liquid to be applied in a subsequent step.

The formation of quantum dot film will now be described. First, the quantum dot liquid is applied by spin coating in such a manner that the quantum dot liquid is dropped to the center of the substrate placed in a spin coater. The spin coating is performed, for example, at 2500 rpm for 30 seconds. The resulting quantum dot film formed by spin coating is an aggregate of quantum dots protected by oleic acid having a long molecular length, and, accordingly, the quantum dots have large distances between each dot. Consequently, the quantum dots are poor in photocarrier conductivity and thus in photoelectric conversion. The resulting quantum dot film is herein referred to as the oleic acid-protected quantum dot film.

The oleic acid-protected quantum dot film is poor in photoelectric conversion and is known to replace molecules coordinated to the quantum dots. More specifically, oleic acid is replaced with a substance having a shorter molecular length than oleic acid. This replacement is hereinafter referred to as ligand exchange, and, in some cases, a substance used for ligand exchange may be referred to simply as a ligand. Also, a solution used for ligand exchange may be referred to as a ligand solution. The embodiment described here uses 1,3-benzenedithiol (1,3-BDT) or 4-mercaptobenzoic acid (4-MBA) as an organic ligand. The functional group of 1,3-Benzenedithiol is only the thiol group, while 4-MBA has a thiol group and a carboxy group. The ligand solution for ligand exchange may be 3 mM solution of 1,3-BDT in acetonitrile or 10 mM solution of 4-MBA in methanol. After ligand exchange using such an organic ligand, a halogen (fluorine, chlorine, bromine, or iodine) may be added as an inorganic ligand. If iodine is added, for example, 10 mM solution of lead iodide in N,N-dimethylformamide may be used. The halogen added as an inorganic ligand coordinates to lead or sulfur defective sites at the surfaces of quantum dots, where passivation by only an organic ligand is difficult due to steric hindrance, thus enabling passivation.

For ligand exchange, the ligand solution described above is applied onto the oleic acid-protected quantum dot film formed on the substrate. More specifically, the ligand solution is applied over the entire surface of the oleic acid-protected quantum dot film for a ligand exchange reaction for a predetermined time. In either ligand exchange reaction using 1,3-BDT or 4-MBA, the reaction time can be 30 seconds. The reaction time, however, may be appropriately set according to, for example, the concentration of the ligand solution. After a predetermined time has passed for reaction, the substrate is spun at 200 rpm for 60 s to remove the excess ligand solution from the substrate. Then, the substrate is rinsed with acetonitrile or methanol, which is a solvent used to dissolve the ligand, to remove the excess ligand remaining at the quantum dots. Furthermore, the substrate is rinsed with octane to remove oleic acid separate from the quantum dots.

Another oleic acid-protected quantum dot film may be further formed on the ligand-exchanged quantum dot film for ligand exchange, followed by rinsing. This sequence of steps may be repeated a plurality of times to form a plurality of quantum dot films. Thus formed 1,3-BDT or 4-MBA quantum dot film structure with a predetermined thickness can be used as a functional layer 133. In such formation of the functional layer 133, some ligand substances may be used so that the functional layer 133 can be defined by quantum dot films using different ligands. For example, the functional layer may be formed by forming one or more 1,3-quantum dot films as the functional layers 133A and 133B and one or more 4-MBA quantum dot films as the functional layer 133C. In the semiconductor device disclosed herein, image lag and photocurrent fluctuation can be reduced by appropriately designing the internal layers of the functional layer.

Subsequently, a second electrode 134 is formed. An electron blocking layer may be formed between the functional layer 133 and the second layer 134, as described above. In an embodiment, the electron blocking layer may be formed of molybdenum oxide by vapor deposition. Then, an insulating layer 136, a color filter layer 137, a planarizing layer 138, and a microlens layer 139 are formed in this order. These layers can be formed in conventional semiconductor processes, and thus description thereof is omitted. Thus, the semiconductor device depicted in FIG. 2A can be produced, as described above.

Through the above-described process, the oleic acid molecules bound to atoms at the surfaces of the nanoparticles of the oleic acid-protected quantum dot film are separated and replaced with predetermined ligand molecules. Thus, a 1,3-BDT or 4-MBA quantum dot film is formed. The thickness of the 1,3-BDT or 4-MBA quantum dot film after ligand exchange is 40 nm to 60 nm. After the ligand exchange using an organic ligand, a halogen may be added as an inorganic ligand. For example, a lead iodide solution may be used for adding iodine as the halogen. The reaction time for adding iodine may be 3 minutes. The reaction time can be varied depending on conditions. Ligand exchange may be performed using only an inorganic ligand without using any organic ligand.

Display Device Using the Semiconductor Device

The semiconductor device according to an embodiment of the present disclosure may be used in a display device. The display device includes a light-emitting element having the functional layer disclosed herein. The light-emitting element is connected to an active element, such as a transistor, for controlling emission time and emission brightness.

Figure 5C:
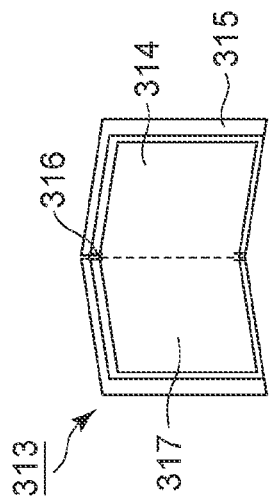
FIGS. 5C and 5D are illustrative representations of display units, each including a light-emitting device according to an embodiment of the disclosure.
Figure 5D:
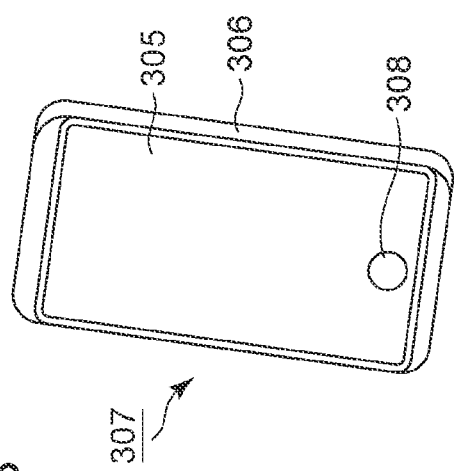
Figure 5A:
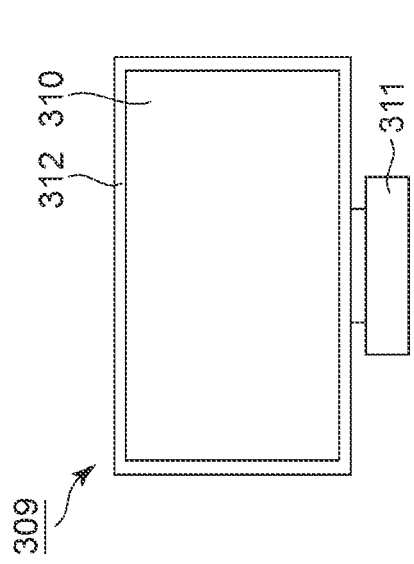
FIG. 5A is an illustrative representation of an imaging device including a display device according to an embodiment of the disclosure.

FIGS. 5A to 5D illustrate applications of the display device according to the present disclosure. FIG. 5A is a schematic view of an imaging device including a display device according to an embodiment of the present disclosure. The imaging device 300 may include a viewfinder 301, a rear display 302, an operational section 303, and a housing 304. The viewfinder 301 may include a display device according to an embodiment of the present disclosure. In this instance, the display device may display not only taken pictures but also environmental information, imaging instructions, or the like. The environmental information may include, for example, the intensity and the direction of external light, the moving speed of a subject to be shot, and the possibility that the subject is hidden by an object. In an embodiment, the display device may be used in the rear display 302.

The imaging device 300 includes an optical system (not shown). The optical system includes a plurality of lenses and forms an image on an imaging element in the housing 304. The focus can be adjusted by adjusting the relative positions of the plurality of lenses. This may be automatically performed. The imaging device may be referred to as a photoelectric conversion device. The photoelectric conversion apparatus may form images not by forming images one after another but by detecting a difference from the previous image or by cutting one or more images out of the images being always recorded.

Figure 5B:
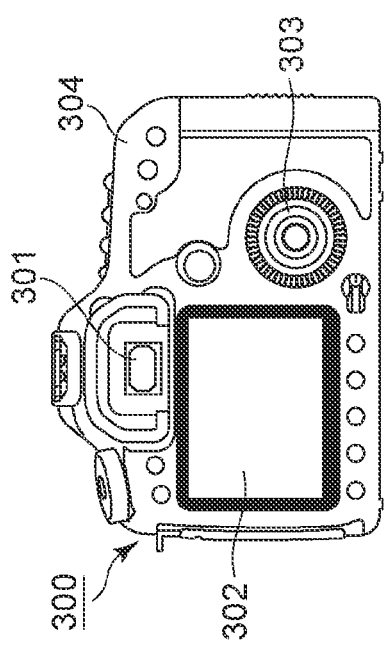
FIG. 5B is an illustrative representation of an electronic apparatus including a display device.

FIG. 5B is a schematic view of an electronic apparatus including a display device according to an embodiment of the present disclosure. The electronic apparatus 307 includes a display section 305, an operational section 308, and a housing 306. The housing 306 contains a circuit, a printed board having the circuit, a battery, and a communication section. The operational section 308 may be a button or a touch panel responding section. The responder may generate or receive ultrasonic waves or the like for biometric authentication using fingerprints or the like. The operational section 308 may have a function of biometrical authentication to recognize fingerprints and releasing the lock. An electronic apparatus including a communication section may be referred to as a communication apparatus. The electronic apparatus may further include a lens and an imaging element, thus functioning as a camera as well as other functions. An image taken by the function as a camera is displayed on the display section 305. Such an electronic apparatus may be a smartphone, a mobile PC, or the like.

FIG. 5C is a schematic view of a display device according to an embodiment of the present disclosure. FIG. 5C depicts a display device, such as a TV monitor or a PC monitor. This display device 309 includes a frame 312 and a display section 310. The display section 310 may include a light-emitting device according to an embodiment of the present disclosure.

The display unit also includes a base 311 supporting the frame 312 and the display section 310. The base 311 is not limited to the form depicted in FIG. 5C. The lower side of the frame 312 may serve as the base, or the display unit may be a wall-mounted type or a roll-up type, without using the base 311.

The frame 312 and the display section 310 may be curved. The radius of curvature thereof may be in the range of 5000 mm to 6000 mm.

FIG. 5D is a schematic view of a display device according to another embodiment of the present disclosure. The display device 313 depicted in FIG. 5D is a foldable display device. The display device 313 includes a first display section 317, a second display section 314, and a housing 315 and has a folding line 316. The first display section 317 and the second display section 314 each may include a light-emitting device according to an embodiment of the present disclosure. The first display section 317 and the second display section 314 may define a one-piece continuous display without using a joint. The first display section 317 and the second display section 314 may be separated from each other along the folding line 316. The first display section 317 and the second display section 314 may display different images from each other, or a single image may be displayed across the first and second display sections.

Imaging System Using Semiconductor Device

An imaging system and a moving body according to an embodiment will now be described with reference to FIGS. 6A and 6B.

Figure 6A:
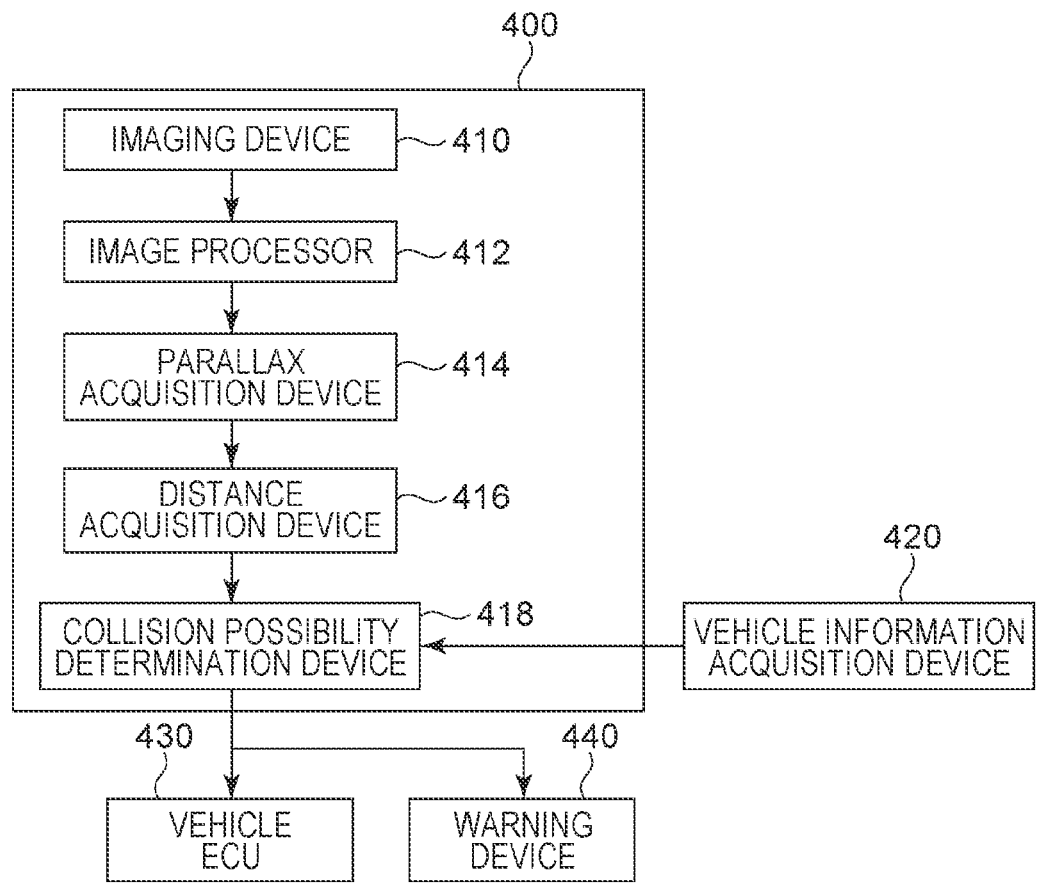
FIGS. 6A and 6B are diagrams illustrating the structures of an imaging system and a moving body, respectively, according to an embodiment.
Figure 6B:
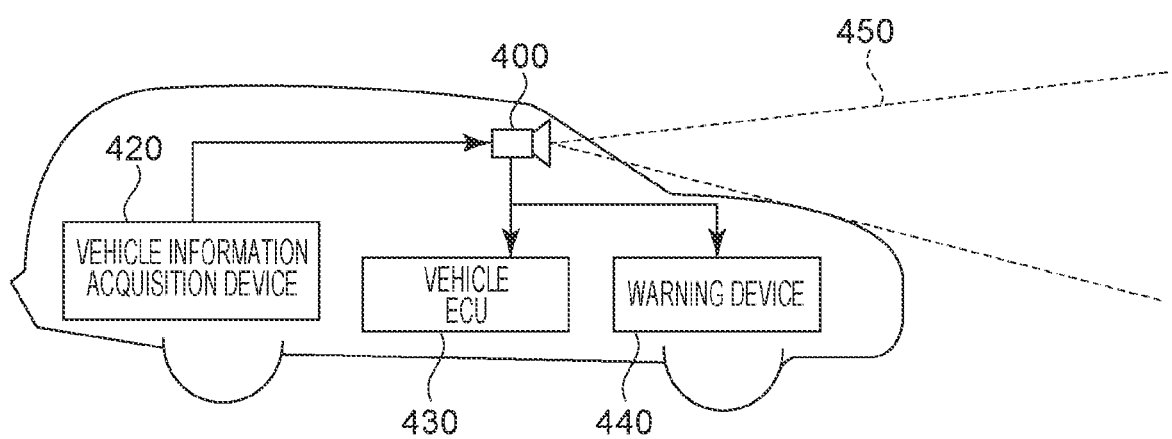

FIGS. 6A and 6B are block diagrams illustrating the structures of an imaging system and a moving body, respectively. FIG. 6A illustrates an imaging system 400 for an in-vehicle camera. The imaging system 400 includes an imaging device 410. The imaging device 410 may be an imaging device according to an embodiment of the present disclosure. The imaging system 400 also includes an image processor 412 that is a device operable to process a plurality of image data obtained by the imaging device 410, and a parallax acquisition device 414 that is a processor operable to calculate parallaxes (phase differences between parallax images) from the plurality of image data obtained by the imaging device 410. Also, the imaging system 400 includes a distance acquisition device 416 that is a processor to calculate the distance from an object based on the calculated parallax, and a collision possibility determination device 418 that is a processor to determine whether there is a possibility of collision based on the calculated distance. The parallax acquisition device 414 and the distance acquisition device 416 are merely examples of information acquisition devices operable to obtain information, such as distance data from an object. The distance data include parallax, defocusing value, and distance from the object. The collision possibility determination device 418 may determine a possibility of a collision by using any of such distance data. The above-described processors may be implemented by dedicated hardware or by general-purpose hardware operable for calculation based on a software module. Alternatively, the processors may be implemented by FPGA (Field Programmable Gate Array), ASIC (Application Specific Integrated Circuit), or the like or a combination thereof.

The imaging system 400 is connected to a vehicle information acquisition device 420 so that the system can receive vehicle information including vehicle speed, yaw rate, and rudder angle. The imaging system 400 is also connected to a vehicle ECU (electronic control unit) 430 that outputs a control signal to generate a braking force against the vehicle according to the determination result of the collision possibility determination device 418. Hence, the ECU 430 is a controller to control a moving body according to the distance data. The imaging system 400 is also connected to a warning device 440 that issues a warning or an alarm to the driver according to the determination result of the collision possibility determination device 418. For example, if the collision possibility determination device 418 determines that the collision possibility is high, the vehicle ECU 430 controls the vehicle to brake, release the accelerator, and reduce the engine output, thereby avoiding collisions and reduce damage. The warning device 440 warns the driver, for example, by sounding an alarm, displaying alarm information on the screen of a car navigation system or the like, or vibrating the seat belt or steering wheel.

In the disclosed embodiment, the imaging system 400 shoots the surroundings of the vehicle, for example, the front or the rear. FIG. 6B illustrates an imaging system 400 that shoots the front (imaging range 450) of the vehicle. The vehicle information acquisition device 420 instructs the imaging system 400 for shooting. By using an imaging device according to an embodiment of the present disclosure as the imaging device 410, the imaging system 400 of the present disclosure can be improved in distance measurement accuracy.

In the illustrated embodiment, the imaging system disclosed herein controls the vehicle to avoid collisions with other vehicles. In another embodiment, however, the imaging system may control self-driving by following other vehicles or self-driving so as not to go out of the lane. The imaging system may also be used in other moving bodies (transport equipment), such as ships, aircraft, and industrial robots. Examples of the moving device used in such moving bodies (transport equipment) include engines, motors, wheels, and propellers. The imaging system may be used not only in moving bodies but also in apparatuses or systems capable of recognizing objects in a wide area, for example, in an intelligent transportation system (ITS).

The photoelectric conversion device according to an embodiment may be used in an imaging device or an imaging system. The imaging system will be described below with reference to FIG. 7.

Figure 7:
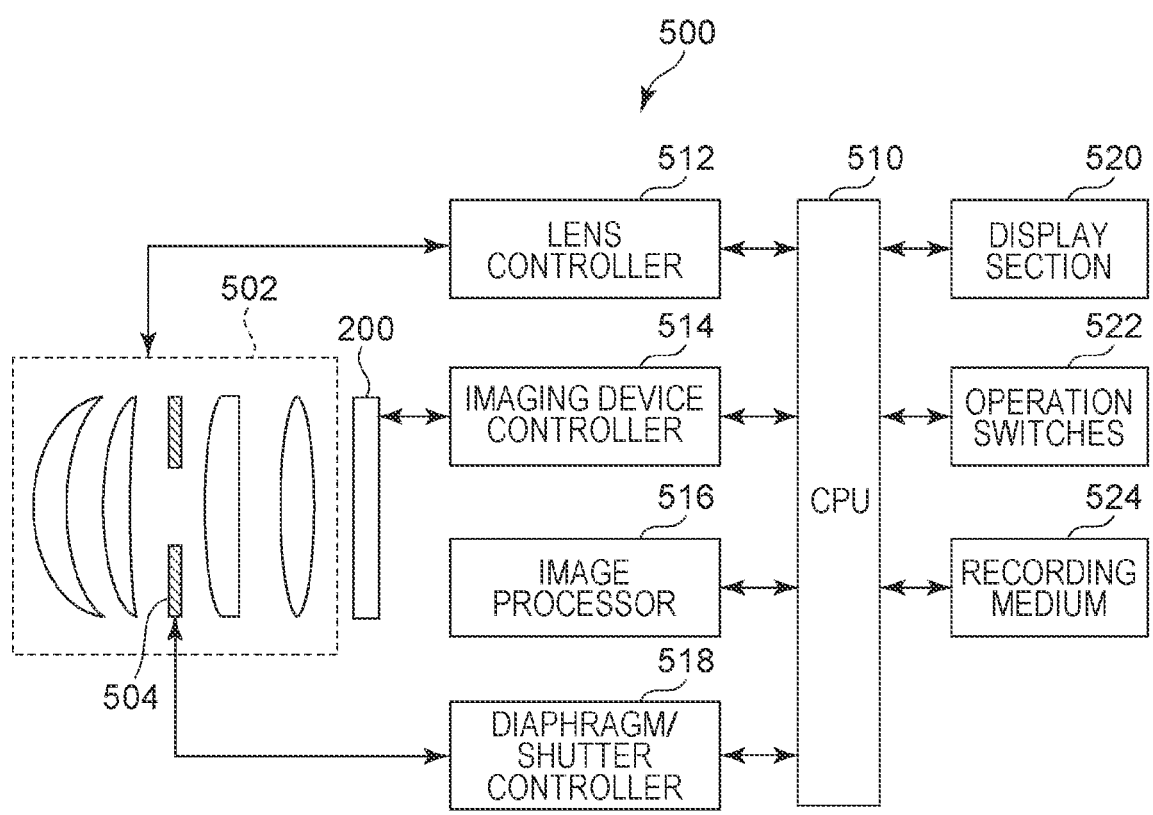
FIG. 7 is a schematic block diagram illustrating the structure of an imaging system according to an embodiment.

FIG. 7 is a schematic block diagram illustrating the structure of an imaging system according to an embodiment.

The photoelectric conversion device disclosed herein can be used in various imaging systems. Such imaging systems include, but are not limited to, digital still cameras, digital camcorders, security cameras, copy machines, facsimiles, mobile phones, in-vehicle cameras, observation satellites, and medical cameras. A camera module including an optical system, such as lenses, and a photoelectric conversion device is also one of the imaging systems. FIG. 7 illustrates a block diagram of a digital still camera as an example of the imaging systems.

The digital still camera, or imaging system, 500 includes a photoelectric conversion device 200, imaging optical system 502, a Central Processing Unit (CPU) 510, a lens controller 512, an imaging device controller 514, an image processor 516, a diaphragm/shutter controller 518, a display section 520, operation switches 522, and a recording medium 524.

The imaging optical system 502 is intended to form an optical image of the subject and includes lenses and diaphragm 504. The diaphragm 504 has an aperture whose diameter can be varied to adjust the amount of light during shooting and, in addition, functions as a shutter to adjust exposure time when still images are taken. The lenses and the diaphragm 504 are held so as to be able to extend and retract in the direction of the optical axis, and such movement of the lenses and the diaphragm enables variable magnification (zooming) and focus adjustment. The imaging optical system 502 may be integrated into the imaging system or may be an imaging lens unit that can be attached to the imaging system.

The photoelectric conversion device 200 is disposed in such a manner that the imaging face of the imaging optical system 502 lies in the image space of the optical system. The photoelectric conversion device 200, which is a semiconductor device acting as a photoelectric conversion device according to an embodiment of the present disclosure, includes a Complementary Metal Oxide Semiconductor (CMOS) sensor (pixel section) and a peripheral circuit (peripheral circuit region). The photoelectric conversion device 200 includes two-dimensionally arranged pixels having a plurality of photoelectric conversion portions, and color filters arranged corresponding to the pixels, thus defining a two-dimensional single plate color sensor. The photoelectric conversion device 200 photoelectrically converts an optical image of a subject formed by the imaging optical system 502 into an image signal or a focus detection signal and outputs the converted signal.

The lens controller 512 controls the extending and retracting movement of the lenses of the imaging optical system 502 to vary the magnification or adjust the focus and includes a circuit or processor configured to thus function. The diaphragm/shutter controller 518 varies the aperture diameter of the diaphragm 504 (variable aperture value) to adjust the amount of imaging light and includes a circuit or processor configured to thus function.

The CPU 510, which is a control device in the camera, controls the camera in various aspects and includes a processor, a Read Only Memory (ROM), a Random Access Memory (RAM), an (analog-to-digital) A/D converter, a D/A (digital-to-analog) converter, and a communication interface circuit. The CPU 510 controls the operation of devices or sections within the camera according to the computer program stored in the ROM or the like and executes a series of imaging operations, such as autofocusing operation including detection of focusing conditions of the imaging optical system 502 (focus detection), imaging, image processing, and recording. The CPU 510 also functions as a signal processor.

The imaging device controller 514 controls the operation of the photoelectric conversion device 200 and, in addition, A/D converts signals outputted from the photoelectric conversion device 200 and transmits the converted signals to the CPU 510. The imaging device controller 514 includes a circuit or controller configure to thus function. The A/D conversion may be a function of the photoelectric conversion device 200. The image processor 516 applies image processing, such as y conversion or color interpolation, to the A/D converted signals, thus generating image signals. The image processor 516 includes a circuit or controller configured to thus function. The display section 520 is, for example, a liquid crystal display (LCD) device and displays information involved in the shooting mode of the camera, a preview image before shooting, a check image after shooting, and a focused state when the focus is detected. The operation switches 522 include a power switch, a release (shooting trigger) switch, a zooming switch, and a shooting mode selection switch. The recording medium 524, onto which taken pictures or images are recorded, may be contained in the imaging system or may be a removable memory card.

The imaging system 500 using a photoelectric conversion device 200 according to an embodiment of the present disclosure can achieve high performance.

The photoelectric conversion device may be of a front or a rear illumination type. The photoelectric conversion device may have a multilayer structure (a stack of chips) including a first semiconductor chip having a plurality of photoelectric conversion portions and a second semiconductor chip having a peripheral circuit. The peripheral circuit of the second semiconductor chip may be a column circuit corresponding to the columns of the pixel arrangement of the first semiconductor chip. Alternatively, the peripheral circuit of the second semiconductor chip may be a matrix circuit corresponding to the pixels or pixel blocks of the first semiconductor chip. The first and second semiconductor chips may be coupled by using through silicon vias (TSV), wiring using conductors such as copper wires, using microbumps, or wire bonding.

The embodiments disclosed above are merely some of the implementations of the disclosure, and the scope of the disclosure is not limited to the disclosed embodiments.

EXAMPLES

The subject matter of the present disclosure will be further described with reference to Examples. In the Examples, elements having a multilayer structure using some ligand substances are evaluated to show that a specific multilayer structure is effective in reducing image lag and photocurrent fluctuation.

Estimation of Image Lag and Photocurrent Fluctuation

Image lag is a phenomenon in which charges are not completely transported by a scan and remain until the next scan. In this instance, the device cannot respond to a sudden change in incident light intensity, thereby forming pictures seeming tailed at the time of actual video shooting. Image lag should be reduced. Photocurrent fluctuation is a phenomenon in which photocurrent fluctuates even when incident light intensity is kept constant. Despite a constant light intensity during actual image shooting, bright pictures are formed. Photocurrent fluctuation should be minimized Image lag and photocurrent fluctuation can be estimated by measuring transient current response of the photoelectric conversion elements between the first electrode 131 and the second electrode 134 in an image sensor in a light state with light irradiation and in a dark state with no light irradiation.

Figure 8A:
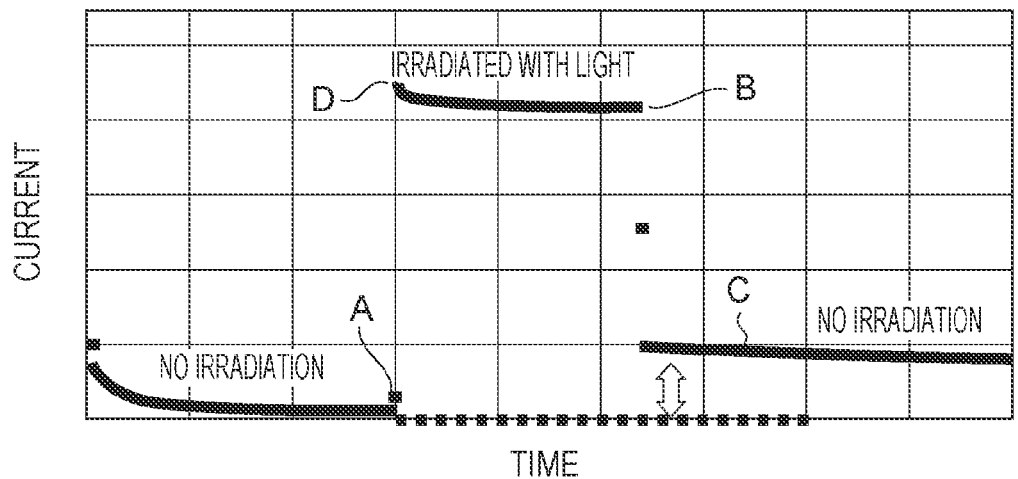
FIGS. 8A and 8B are each a plot of measurements of residues of generated electrons and changes in current in a device according to an embodiment.
Figure 8B:
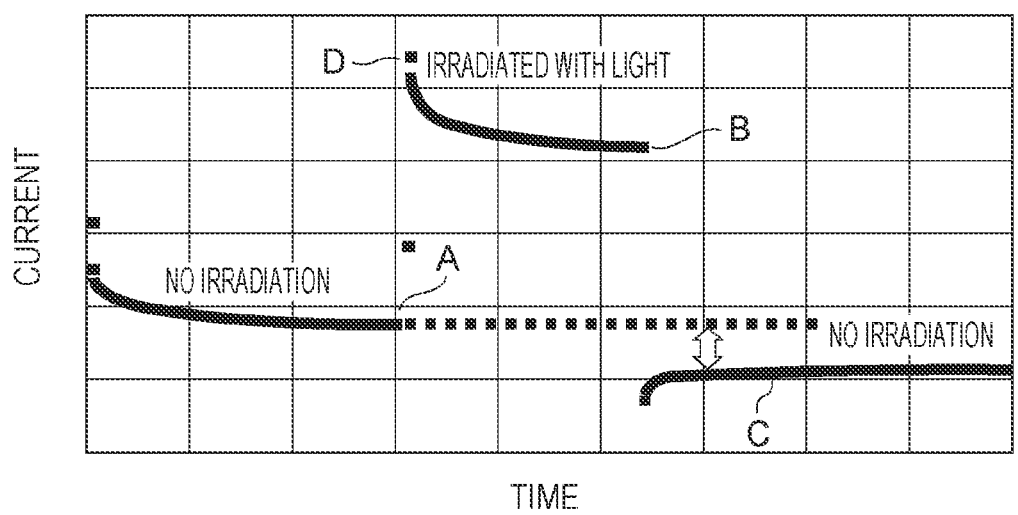

FIGS. 8A and 8B are each a plot of measurements of residues of generated electrons and changes in current in a photoelectric conversion element according to an embodiment. FIG. 8A presents measurements in the case of using MBA as a ligand in the layer corresponding to the functional layer 133C. FIG. 8B presents measurements in the case of using a ligand other than MBA in the layer corresponding to the functional layer 133C.

The measurements are evaluated as below. The initial dark current when the element is energized for a certain period until the dark current becomes stable is represented by A. Then, the element is irradiated with light. The photocurrent after a predetermined time has passed from the irradiation is represented by B. Then, the light is turned off. The dark current one minute after turning off the light is represented by C, and the current immediately after starting the light irradiation is represented by D. When the transient current response is measured, a voltage of 4.8 V is applied.

In the description disclosed herein, image lag is quantified by the following equation 1:

$$\text{Image lag}(\%) = |(C-A)|/|(B-A)| \quad (1)$$

In the description disclosed herein, photocurrent fluctuation is quantified by the following equation 2:

$$\text{Photocurrent fluctuation}(\%) = D/B \quad (2)$$

In FIGS. 8A and 8B, the difference in current indicated by "⇔" corresponds to the image lag observed. There are two types of image lag: "whitening" caused when the dark current after the end of light irradiation is higher than the initial dark current, as shown in FIG. 8A; and "blackening" caused when the dark current after the end of light irradiation is lower than the initial dark current, as shown in FIG. 8B.

The materials of the electrodes and ligands and the thicknesses and arrangement of the layers in the sample elements described below are merely examples, and the disclosure is not limited to the disclosed Examples. The first electrode 131 is made of titanium nitride to a thickness of 60 nm. The intermediate layer 132 is made of titanium oxide to a thickness of 50 nm and acts as an adhesion layer and a hole blocking layer. The functional layer 133 is defined by PbS quantum dots. The quantum dots have an average particle size of about 3.0 nm and a band gap energy of about 1.34 eV. For adding a halogen, a lead iodide solution was used. The second electrode 134 was a transparent ITO electrode having a thickness of 40 nm. The sample elements were prepared as described above. The transient response of each element was measured as described above. For the measurement, the element was energized for 5 minutes in a light-off state from the beginning of voltage application and was then irradiated with light for 4 minutes. After the light is turning off again, the measurement was continued for 1 minute. The applied voltage was 4.8 V. For applying voltage and measuring current, a semiconductor parameter analyzer 4156B, manufactured by Agilent, was used. For light irradiation, a surface-emitting white LED TH-100X100SW, manufactured by CCS Inc., was used.

The Table presents Examples and Comparative Examples together. Sample elements of Examples 1 to 5 and Comparative Examples 1 to 5 were prepared under the same conditions except that the functional layers used the ligands presented in the Table. The representations in the Table will now be described. Functional layers were formed to varying thicknesses and are subjected to treatment with varying ligands. EQE (500 nm) represents an external quantum efficiency (%) at 500 nm, which is a typical wavelength of incident light in the visible region. EQE (940 nm) represents an external quantum efficiency (%) at 940 nm, which is a typical wavelength of incident light in the infrared light region. The number of dark electrons (60° C.) is represented by "/s·µm$^2$". The values presented in the Table were measurements obtained by an independent test at an applied voltage of 2 V. Image lag (%) and photocurrent fluctuation (%) are as defined above. The number of dark electrons, image lag, and photocurrent fluctuation were evaluated according to the following criteria. Ratings A>B>C represent, in this order, better evaluation.

Number of Dark Electrons

A: Less than 5000/s·µm$^2$

B: 5000/s·µm$^2$ to less than 10000/s·µm$^2$

C: 10000/s·µm$^2$ or more

Image Lag

A: Less than 0.01%

B: 0.01% to less than 0.1%

C: 0.1% or more

Photocurrent Fluctuation

A: Less than 5%

B: 5% to less than 10%

C: 10% or more

| | Functional layer 133A | Functional layer 133B | Functional layer 133C | EQE (500 nm) | EQE (940 nm) | Number of Dark electrons (60° C.) | Image lag (%) | Photocurrent fluctuation (%) |
|---|---|---|---|---|---|---|---|---|
| Comparative Example 1 | None | 1,3-BDT + PbI₂ (200 nm thick) | None | 50 | 20 | B | C | C |
| Comparative Example 2 | 4-MBA + PbI₂ (50 nm thick) | 1,3-BDT + PbI₂ (150 nm thick) | None | 15 | 5 | A | C | C |
| Comparative Example 3 | None | PbI₂ (400 nm thick) | None | 50 | 34 | C | B | C |
| Comparative Example 4 | None | PbI₂ (300 nm thick) | MPA (100 nm thick) | 66 | 43 | C | C | C |
| Comparative Example 5 | None | 4-MBA (400 nm thick) | None | 3 | 4 | A | C | C |
| Example 1 | None | 1,3-BDT + PbI₂ (150 nm thick) | 4-MBA + PbI₂ (50 nm thick) | 70 | 29 | A | A | A |
| Example 2 | None | 1,3-BDT + PbI₂ (150 nm thick) | 3-MBA + PbI₂ (50 nm thick) | 42 | 14 | A | A | C |
| Example 3 | None | 1,3-BDT + PbI₂ (150 nm thick) | 2-MBA + PbI₂ (50 nm thick) | 38 | 17 | A | A | C |
| Example 4 | None | 1,3-BDT + PbI₂ (350 nm thick) | 4-MBA + PbI₂ (50 nm thick) | 73 | 44 | A | A | A |
| Example 5 | None | 1,3-BDT + PbI₂ (250 nm thick) | 4-MBA + PbI₂ (150 nm thick) | 53 | 33 | A | A | B |

The functional layers 133A, 133B, and 133C in the Table are formed to varying thicknesses and are subjected to treatment with varying ligand substances. For the ligand substances presented in the Table, 1,3-BDT represents 1,3-benzenedithiol; 4-MBA represents 4-mercaptobenzoic acid; 3-MBA represents 3-mercaptobenzoic acid; 2-MBA represents 2-mercaptobenzoic acid; MPA represents 3-mercaptopropionic acid; and PbI₂ represents lead iodide. The molecular structure of the organic substances is presented below. For example, in the case of Comparative Example 1, four quantum dot films, each having a thickness of about 50 nm, are formed in a multilayer structure, thus defining a 200 nm-thick functional layer 133. "None" in the columns of Functional layer 133A and Functional layer 133C represents that the element does not have a quantum dot film that is different from the functional layer 133B and corresponds to the functional layer 133A or 133C. Hence, the functional layer of Comparative Example 5 is defined by only one functional layer having one single, and the functional layer 133B is in contact with the intermediate layer and the electrode.

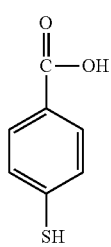

1,4-MBA

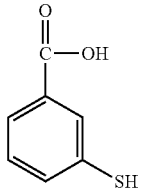

1,3-MBA

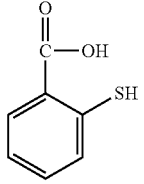

1,2-MBA

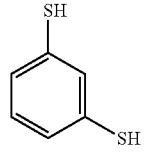

1,3-BDT

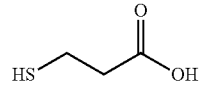

MPA

In Comparative Example 1, the functional layer is defined by only one functional layer 133 that is a quantum dot film using 1,3-BDT and PbI₂ as the ligand. As a result, both the image lag and the photocurrent fluctuation were not sufficiently reduced.

In Comparative Example 2, the functional layer is defined by a multilayer structure composed of a functional layer 133B that is a quantum dot film using 1,3-BDT and PbI₂ as the ligand and a functional layer 133A that is a quantum dot film using 4-MBA and PbI$_2$ as the ligand. Other layers are the same as in Comparative Example 1. While the evaluation in terms of the number of dark electrons was good, both the image lag and the photocurrent fluctuation were not sufficiently reduced.

The photoelectric conversion elements of Comparative Examples 3 and 4 used quantum dots described in U.S. Patent Application Publication No. 2016/0133463. In the production process of the photoelectric conversion elements of Comparative Examples 3 and 4, annealing was not performed in view of stability.

In Comparative Example 3, the functional layer is defined by quantum dots having only PbI$_2$ ligand. Other layers are the same as in Comparative Example 1. The quantum dots having PbI$_2$ ligand was not provided with an organic ligand. As a result, while the evaluation in terms of image lag was rather good, the photocurrent fluctuation was not sufficiently reduced.

In Comparative Example 4, the functional layer is defined by a multilayer structure composed of a functional layer 133B defined by some quantum dot films using PbI$_2$ and a functional layer 133C defined by some quantum dot films using MPA. The photoelectric conversion element of Comparative Example 4 was not satisfactory in terms of the number of dark electrons but exhibited high EQE's of 66% at 500 nm and 43% at 940 nm. However, both the image lag and the photocurrent fluctuation were not sufficiently reduced.

In Comparative Example 5, the functional layer is defined by only one functional layer 133 defined by some quantum dot films using 4-MBA. Other layers are the same as in Comparative Example 1. Since this photoelectric conversion element uses 4-MBA, which is a ligand substance containing a benzene ring and having a high boiling point, the number of dark electrons was sufficiently reduced, but the EQE was low: 3% at 500 nm and 4% at 940 nm. Also, both the image lag and the photocurrent fluctuation were not sufficiently reduced.

In Example 1, the functional layer is defined by a multilayer structure composed of a functional layer 133B defined by some quantum dot films using 1,3-BDT and PbI$_2$ as the ligand and a functional layer 133C defined by a quantum dot film using 4-MBA and PbI$_2$ as the ligand. The resulting element, even after annealing at 170° C. for one hour, exhibited EQE's of 70% at 500 nm and 29% at 940 nm, and the number of electrons at 60° C. was rated A. Thus, the photoelectric conversion performance was high. In addition, the evaluations in terms of image lag and photocurrent fluctuation were higher than those of any of Comparative Examples 1 to 5.

The structure of Example 1 is different in the position of the functional layer using 4-MBA as the ligand from the structure of Comparative Example 2. More specifically, in Example 1, the layer using 4-MBA is disposed between the functional layer 133B and the cathode. In contrast, in Comparative Example 2, the layer using 4-MBA is disposed between the anode and the functional layer 133B. It is, therefore, beneficial to arrange the functional layer C using 4-MBA between the functional layer 133B and the cathode. The functional layer B can be a photoelectric conversion layer mainly for photoelectric conversion. The functional layer B may have a higher photoelectric conversion efficiency than the functional layers A and C.

Examples 2 and 3 used 3-MBA and 2-MBA, respectively, instead of 4-MBA. 3-MBA and 2-MBA are each different from 4-MBA in the position of benzoic acid substituted by thiol.

In Example 2, the functional layer is defined by a multilayer structure composed of a functional layer 133B defined by some quantum dot films using 1,3-BDT and PbI$_2$ as the ligand and a functional layer 133C defined by a quantum dot film using 3-MBA and PbI$_2$ as the ligand. Other layers are the same as in Example 1. The resulting element, even after annealing at 170° C. for one hour, exhibited EQE's of 42% at 500 nm and 14% at 940 nm, and the number of electrons at 60° C. was rated A. Also, the photocurrent fluctuation was not sufficiently reduced, while the evaluation in terms of image lag was high.

In Example 3, the functional layer is defined by a multilayer structure composed of a functional layer 133B defined by some quantum dot films using 1,3-BDT and PbI$_2$ as the ligand and a functional layer 133C defined by a quantum dot film using 2-MBA and PbI$_2$ as the ligand. Other layers are the same as in Example 1. The resulting element, even after annealing at 170° C. for one hour, exhibited EQE's of 38% at 500 nm and 17% at 940 nm, and the number of electrons at 60° C. was rated A. Also, the photocurrent fluctuation was not sufficiently reduced, while the evaluation in terms of image lag was high.

The results of Examples 1 to 3 show that the presence, in the functional layer 133C, of an MBA having an aromatic ring to which a thiol group and a carboxy group are bound reduced image lag, independent of substitution positions.

In contrast, Comparative Example 4, in which the functional layer 133C used MPA having a thiol group and a carboxy group but no aromatic ring, did not sufficiently reduce image lag. This suggests that aromatic compounds having a thiol group and a carboxy group are effective in reducing image lag. In particular, 4-MBA is effective in reducing image lag but also reducing photocurrent fluctuation, thus useful as a material of the photoelectric conversion element.

Furthermore, photocurrent fluctuation was compared among Examples 1 to 3. MBA has a thiol and a carboxy group, which coordinate with Pb at the surfaces of quantum dots. 4-MBA is para-substituted by a thiol and a carboxy group; and 3-MBA and 2-MBA are meta- and ortho-substituted, respectively. Accordingly, 4-MBA can cross-link between quantum dots, while 3-MBA and 2-MBA are more likely than 4-MBA to increase the distance between quantum dots. The larger the distance between quantum dots, the lower the performance of carrier transport. If the functional layer 133B uses 1,3-BDT and the functional layer 133C uses 3-MBA or 2-MBA, holes are likely to be accumulated at the interface between these functional layers, inhibiting the current based on the electrons generated in the functional layers. This is probably the reason for decrease in photocurrent during irradiation. Therefore, organic ligands having an aromatic ring para-substituted by a thiol group and a carboxy group are more beneficial.

Sample elements of Examples 4 and 5 were prepared in the same manner as in Example 1, except that the thicknesses of the functional layer 133B using 1,3-BDT and PbI$_2$ as the ligand and the functional layer 133C using 4-MBA and PbI$_2$ were varied. In Example 1, the 150 nm-thick functional layer 133B and the 50 nm-thick functional layer 133C had a total thickness of 200 nm. In contrast, the functional layers in Examples 4 and 5 had a total thickness of 400 nm. Since the photoelectric conversion layer, or functional layers, 133 is disposed between the first electrode and the second electrode, the total thickness of the functional layers corresponds to the distance between the electrodes. If a boundary layer, such as the intermediate layer 132 or the electron blocking layer (not shown), is provided between an electrode and the photoelectric conversion layer, the total thickness of the photoelectric conversion layer 133 is defined by reducing the thickness of such a boundary layer from the distance between the electrodes.

The boundaries between each layer can be determined by composition analysis in the thickness direction using, for example, a cross-section transmission electron microscope (cross-section TEM) or time-of-flight secondary ion mass spectrometry (TOF-SIMS). The percentage of the functional layer 133C to the total thickness, calculated by (functional layer 133C thickness)/(total thickness)×100, represents the proportion of functional layer 133C occupying the element structure from the second electrode toward the first electrode.

In Example 4, the percentage of the functional layer 133C is 12.5%. The resulting element, even after annealing at 170° C. for one hour, exhibited EQE's of 73% at 500 nm and 44% at 940 nm, and the number of electrons at 60° C. was rated A. Also, both the image lag and the photocurrent fluctuation were sufficiently reduced. The percentage of the functional layer 133C in Example 4 was as small as 12.5%, smaller than that in Example 1, in which it was 25%. The element of Example 4 was, however, produced substantially the same effect in terms of image lag and photocurrent fluctuation. Furthermore, EQE at 940 nm was increased. This is because light absorption was increased by increasing the thickness of the functional layer 133B involved mainly in light absorption for photoelectric conversion.

In Example 5, the percentage of the functional layer 133C is 37.5%. The resulting element, even after annealing at 170° C. for one hour, exhibited EQE's of 53% at 500 nm and 33% at 940 nm, and the number of electrons at 60° C. was rated A. While the image lag was sufficiently reduced, the photocurrent fluctuation was not much reduced compared to Examples 1 and 4. This is because the thickness of the functional layer B was smaller and the thickness of the functional layer C was larger, compared to Example 4.

The results of Example 1 (percentage of functional layer 133C thickness: 25%), Example 4 (percentage of functional layer 133C thickness: 12.5%), and Example 5 (percentage of functional layer 133C: 37.5%) show that the presence of the functional layer 133C using 4-MBA between the functional layer B and the cathode resulted in reduced image lag. The results suggest that when the thickness of the functional layer using MBA accounts for 25% or less of the total thickness of the functional layers, the element can exhibit high current properties, as well as reduced image lag. The functional layer 133C includes at least a 4-MBA-coordinated quantum dot film and has a thickness as large as the quantum dot particle size of 3 nm, accounting for 1.5% of the total thickness. In other words, in an embodiment in which a second functional layer is provided between the cathode and the first functional layer having a high photoelectric conversion efficiency, the thickness of the second functional layer is 1.5% to 25% relative to the distance between the electrodes.

As described above, the disclosure can provide a semiconductor device that has a stable current when irradiated with light.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-015879 filed Jan. 31, 2020, which is hereby incorporated by reference herein in its entirety.

What is claimed is:

1. A semiconductor device comprising:
an anode;
a cathode;
a first functional layer between the anode and the cathode, the first functional layer containing a first quantum dot having a first ligand; and
a second functional layer between the first functional layer and the cathode, the second functional layer containing a second quantum dot having a second ligand different from the first ligand, the second ligand being an aromatic compound having a sulfide bond and an ester bond.

2. The semiconductor device according to claim 1, wherein the first functional layer has a higher photoelectric conversion efficiency than the second functional layer.

3. The semiconductor device according to claim 1, wherein the second functional layer has a thickness of 25% or less relative to a distance between the anode and the cathode.

4. The semiconductor device according to claim 1, wherein the second functional layer has a thickness of 1.5% to 25% relative to a distance between the anode and the cathode.

5. The semiconductor device according to claim 1, wherein the second ligand of the second quantum dot contained in the second functional layer is selected from a group consisting of 4-mercaptobenzoic acid, 3-mercaptobenzoic acid, and 2-mercaptobenzoic acid.

6. The semiconductor device according to claim 1, wherein the first functional layer and the second functional layer are each a quantum dot film defined by colloidal quantum dots.

7. The semiconductor device according to claim 1, wherein at least one of the first and second functional layers contains a halogen selected from the group consisting of iodine, chlorine, bromine, and fluorine.

8. The semiconductor device according to claim 1, wherein the first functional layer and the second functional layer act as photoelectric conversion layers.

9. The semiconductor device according to claim 1, wherein the first and second quantum dots of the first and second functional layers contain PbS or PbSe.

10. The semiconductor device according to claim 1, wherein the semiconductor device converts incoming light into a signal and outputs the signal.

11. An imaging system comprising:
the semiconductor device as set forth in claim 1, and
a processor operable to process signals outputted from the semiconductor device.

12. A moving body comprising:
the semiconductor device as set forth in claim 1;
a moving device;
a processor operable to acquire information from signals outputted from the semiconductor device; and
a controller operable to control the moving device according to the information.

13. The semiconductor device according to claim 1, wherein the first ligand has a thiol group; and
wherein the second ligand has a carboxy group, and the ester bond of the second ligand is included in the carboxy group.

* * * * *